US012615841B2

(12) United States Patent
Xie et al.

(10) Patent No.: US 12,615,841 B2
(45) Date of Patent: Apr. 28, 2026

(54) FORKSHEET TRANSISTOR WITH ADVANCED CELL HEIGHT SCALING

(71) Applicant: INTERNATIONAL BUSINESS MACHINES CORPORATION, Armonk, NY (US)

(72) Inventors: Ruilong Xie, Niskayuna, NY (US); Kisik Choi, Watervliet, NY (US); Tenko Yamashita, Schenectady, NY (US); Dechao Guo, Niskayuna, NY (US)

(73) Assignee: International Business Machines Corporation, Armonk, NY (US)

( * ) Notice: Subject to any disclaimer, the term of this patent is extended or adjusted under 35 U.S.C. 154(b) by 372 days.

(21) Appl. No.: 18/498,097

(22) Filed: Oct. 31, 2023

(65) Prior Publication Data

US 2025/0142892 A1     May 1, 2025

(51) Int. Cl.
| | |
|---|---|
| *H10D 84/85* | (2025.01) |
| *H10D 62/10* | (2025.01) |
| *H10D 62/13* | (2025.01) |
| *H10D 64/01* | (2025.01) |
| *H10D 84/01* | (2026.01) |
| *H10D 84/03* | (2025.01) |
| *H10D 84/83* | (2025.01) |

(52) U.S. Cl.
CPC ......... *H10D 84/852* (2025.01); *H10D 62/121* (2025.01); *H10D 62/151* (2025.01); *H10D 64/017* (2025.01); *H10D 84/0128* (2025.01); *H10D 84/013* (2025.01); *H10D 84/0135* (2025.01); *H10D 84/038* (2025.01); *H10D 84/83* (2025.01)

(58) Field of Classification Search
CPC .................................................... H10D 84/852
See application file for complete search history.

(56)            References Cited

U.S. PATENT DOCUMENTS

| | | | |
|---|---|---|---|
| 9,614,056 | B2 | 4/2017 | Xie |
| 11,515,399 | B2 | 11/2022 | Dentoni Litta |
| 2021/0210489 | A1 | 7/2021 | Zhang |
| 2021/0376076 | A1* | 12/2021 | Su ........................ H10D 62/116 |

(Continued)

FOREIGN PATENT DOCUMENTS

| | | |
|---|---|---|
| CN | 116130418 A | 5/2023 |
| EP | 3886145 A1 | 9/2021 |

*Primary Examiner* — Steven B Gauthier
*Assistant Examiner* — E. Rhett Cheek
(74) *Attorney, Agent, or Firm* — Yuanmin Cai

(57)            ABSTRACT

Embodiments of present invention provide a semiconductor structure. The semiconductor structure includes a dielectric bar having a left sidewall and a right sidewall; a first nanosheet transistor having a first set of channel nanosheets in direct contact with the left sidewall of the dielectric bar; and a second nanosheet transistor having a second set of channel nanosheets in direct contact with the right sidewall of the dielectric bar, where a first portion of the dielectric bar between the first and the second set of channel nanosheets has a first height; a second portion of the dielectric bar between a first source/drain region of the first nanosheet transistor and a second source/drain region of the second nanosheet transistor has a second height; and the first height is higher than the second height. A method of forming the same is also provided.

19 Claims, 27 Drawing Sheets

(56)                  References Cited

U.S. PATENT DOCUMENTS

| | | | |
|---|---|---|---|
| 2022/0328477 A1 | 10/2022 | Chen | |
| 2023/0095140 A1 | 3/2023 | Xie | |
| 2023/0207553 A1 | 6/2023 | Xie | |
| 2024/0079451 A1* | 3/2024 | Lin | H10D 62/151 |
| 2024/0105786 A1* | 3/2024 | Liang | H10D 62/021 |
| 2024/0120338 A1* | 4/2024 | Lin | H10D 84/852 |
| 2024/0178128 A1* | 5/2024 | Chen | H10D 30/6729 |
| 2025/0087643 A1* | 3/2025 | Chan | H10B 10/125 |
| 2026/0026050 A1* | 1/2026 | Liang | H10D 62/021 |

* cited by examiner

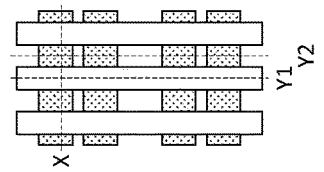
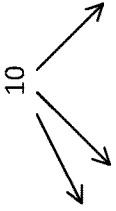
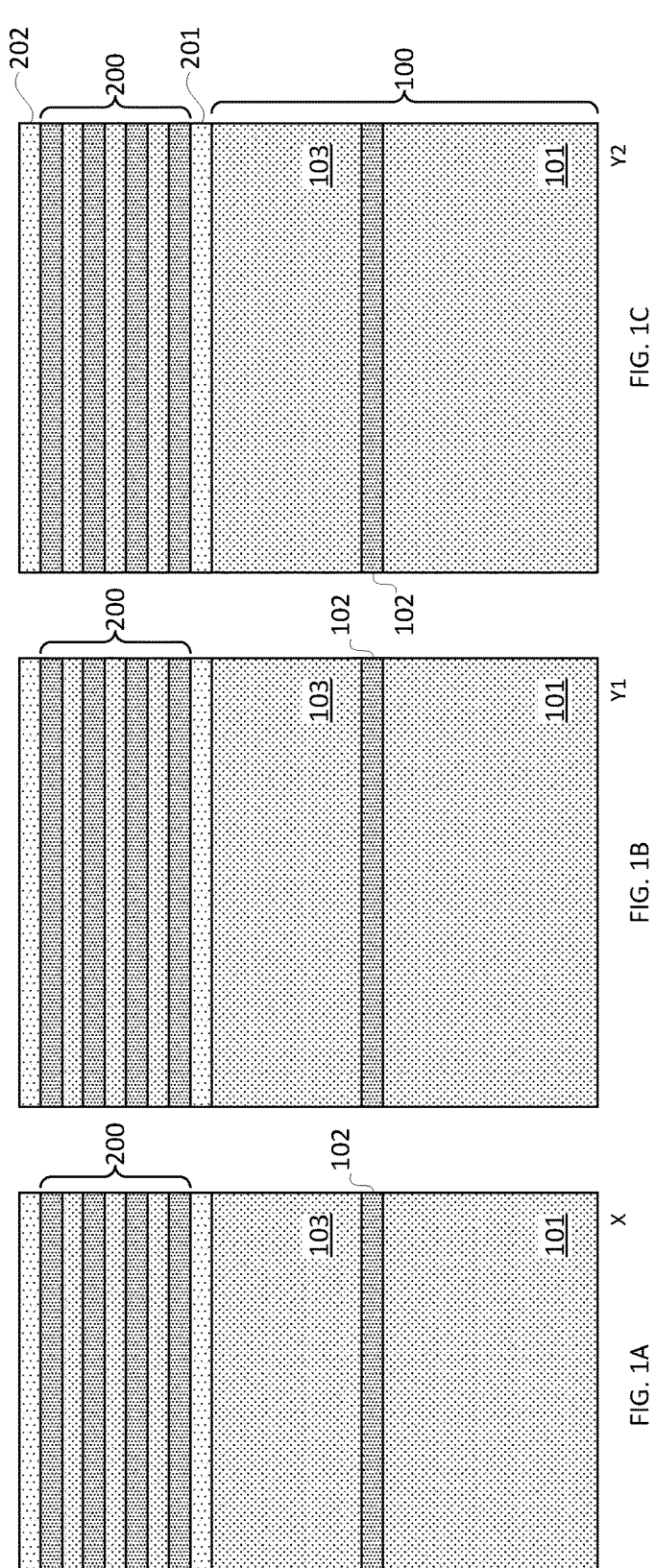

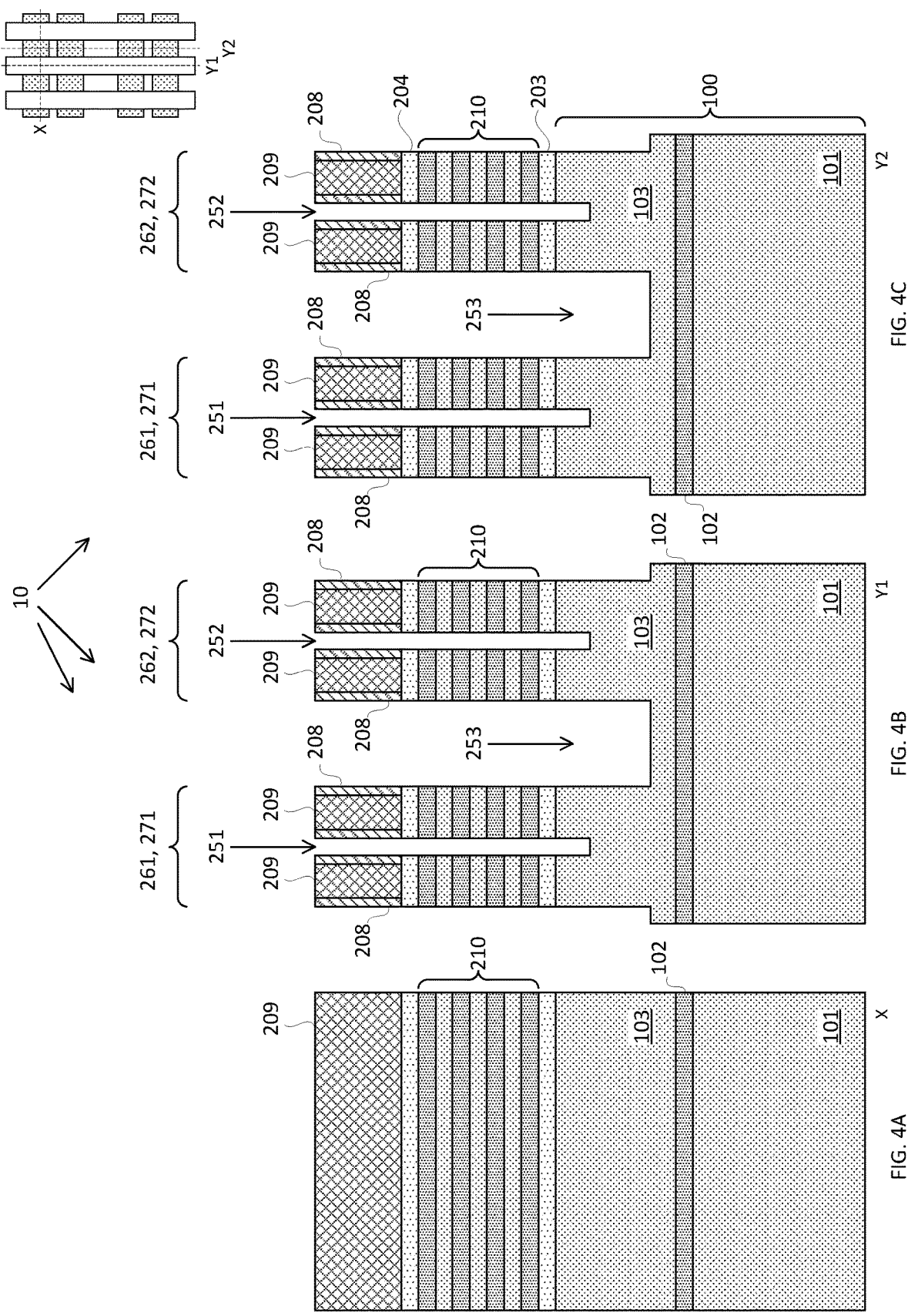

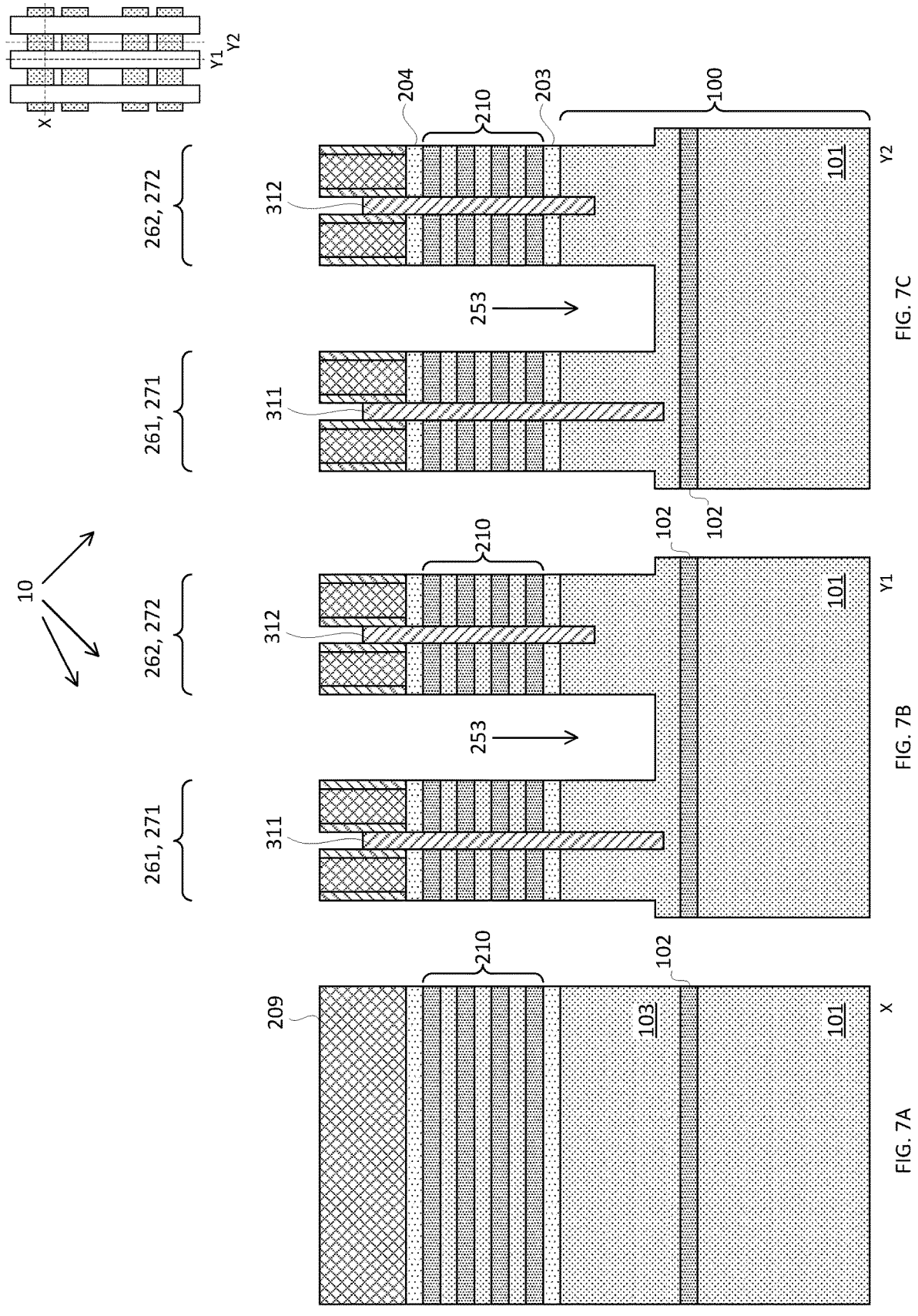

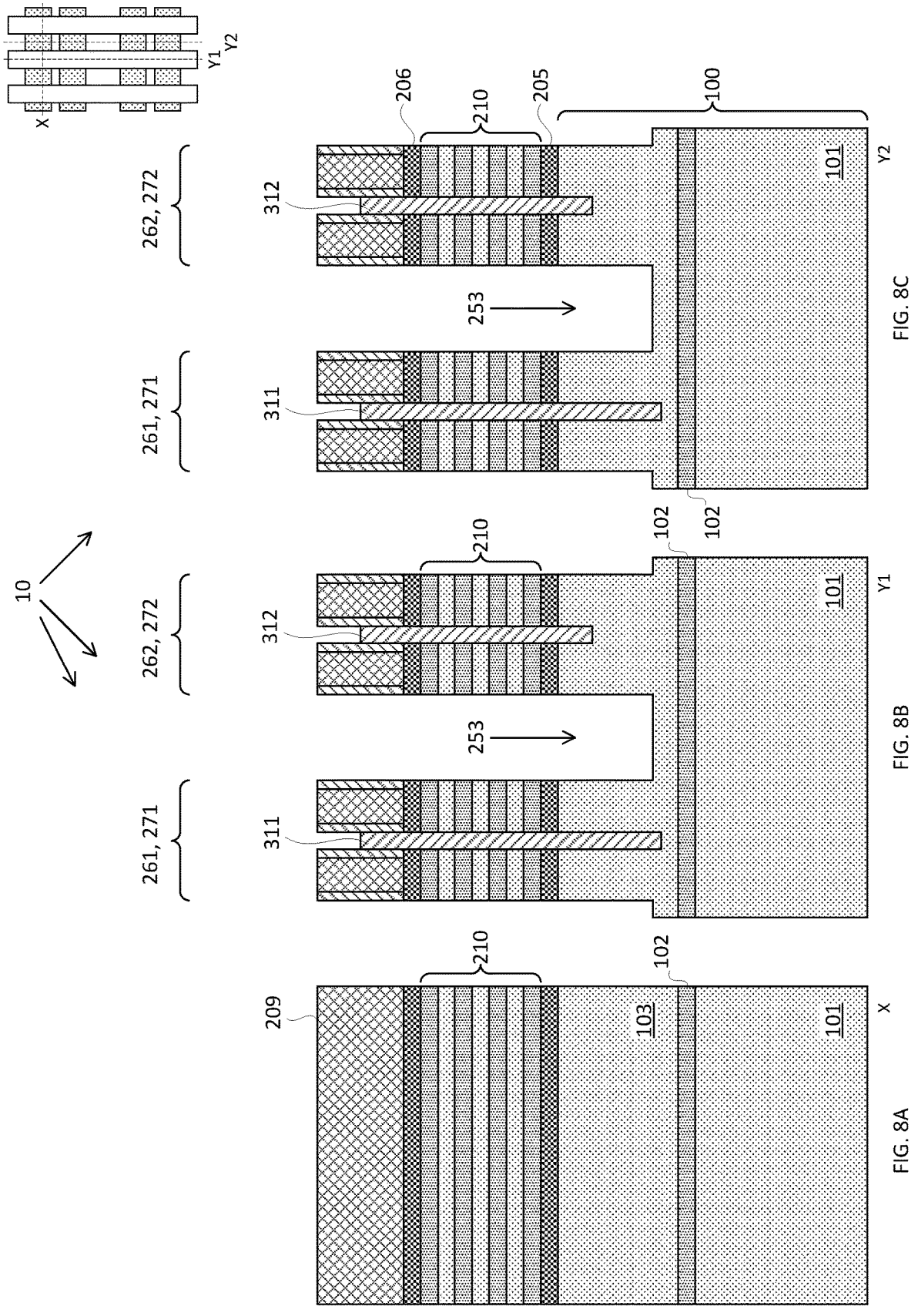

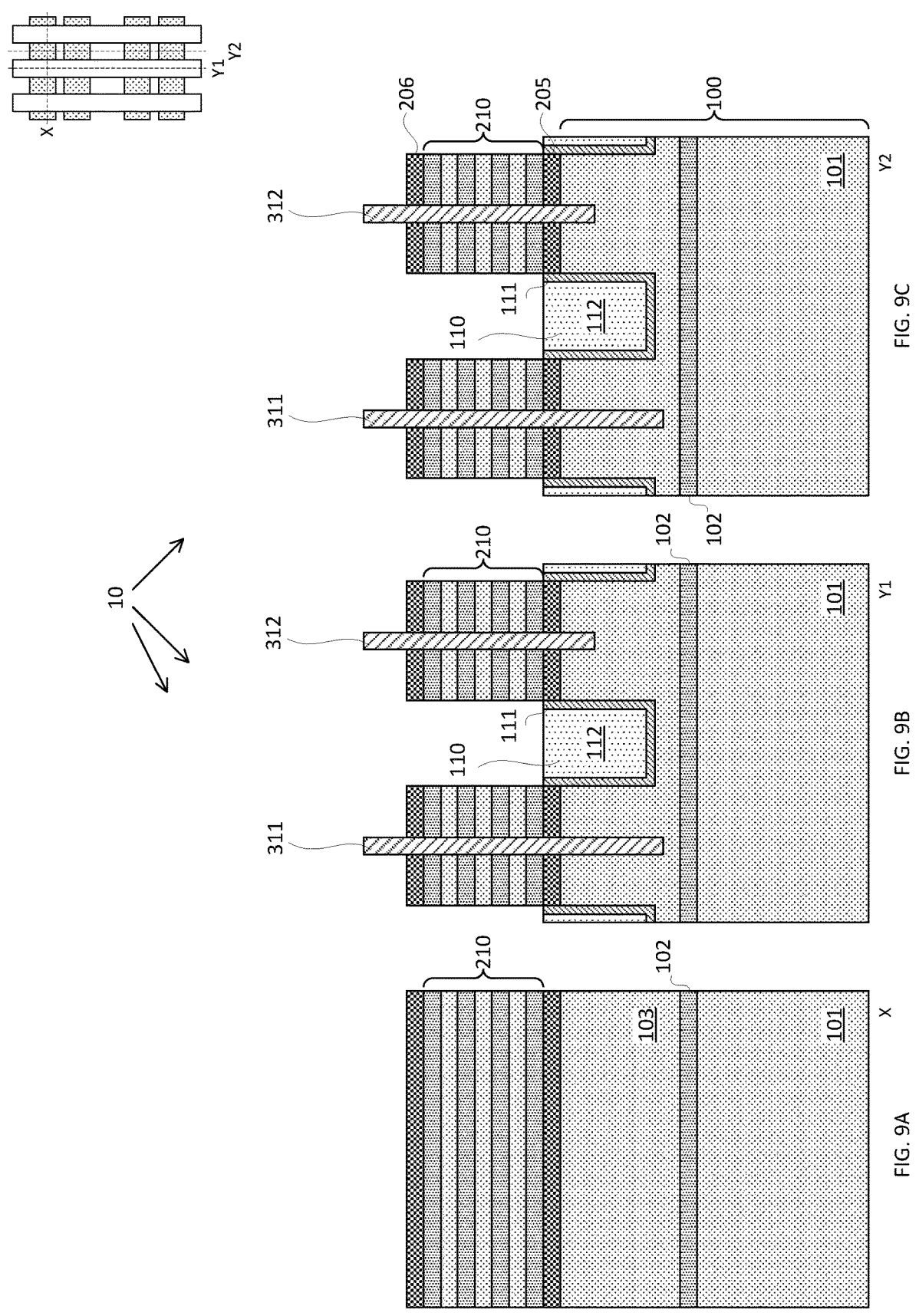

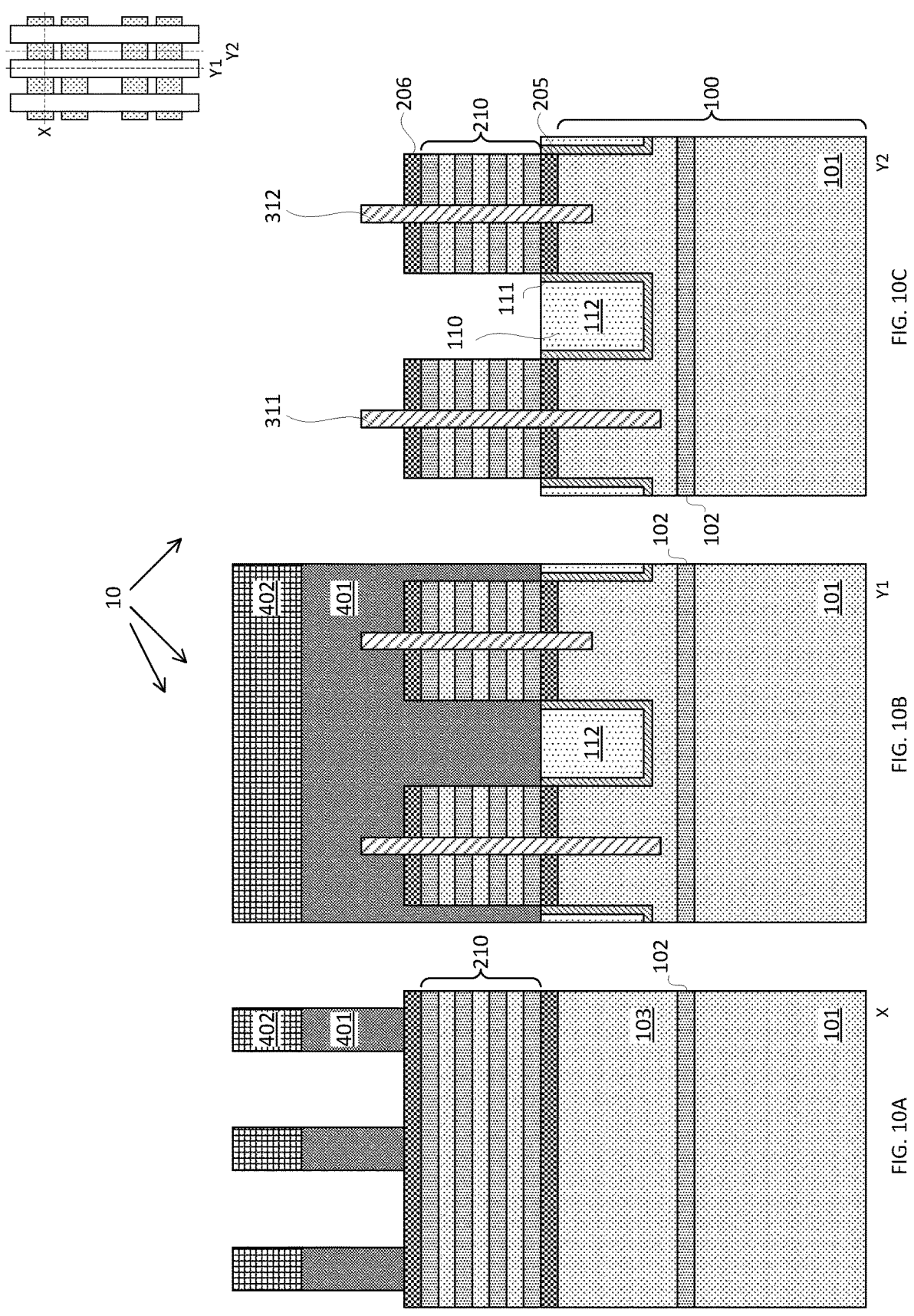

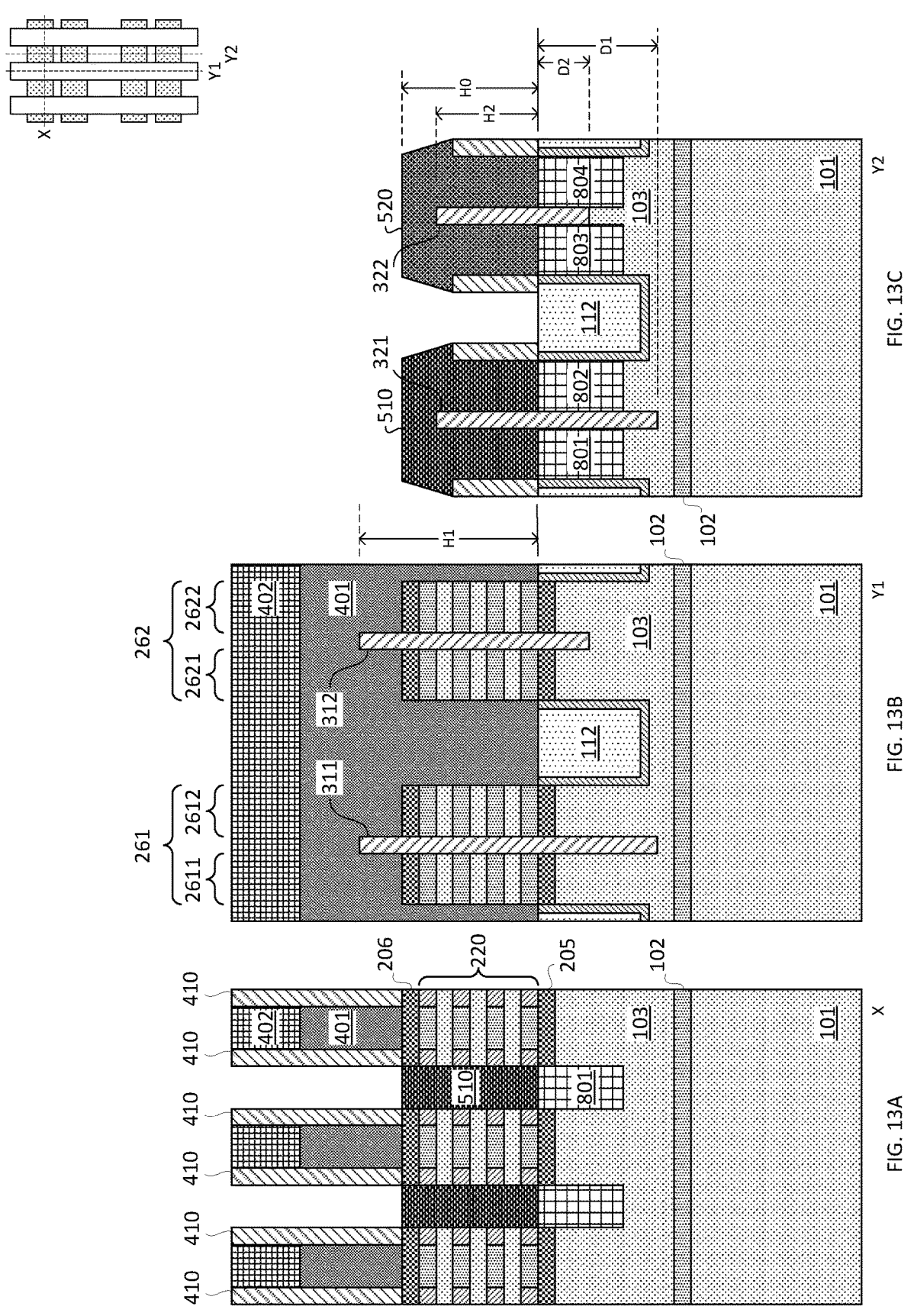

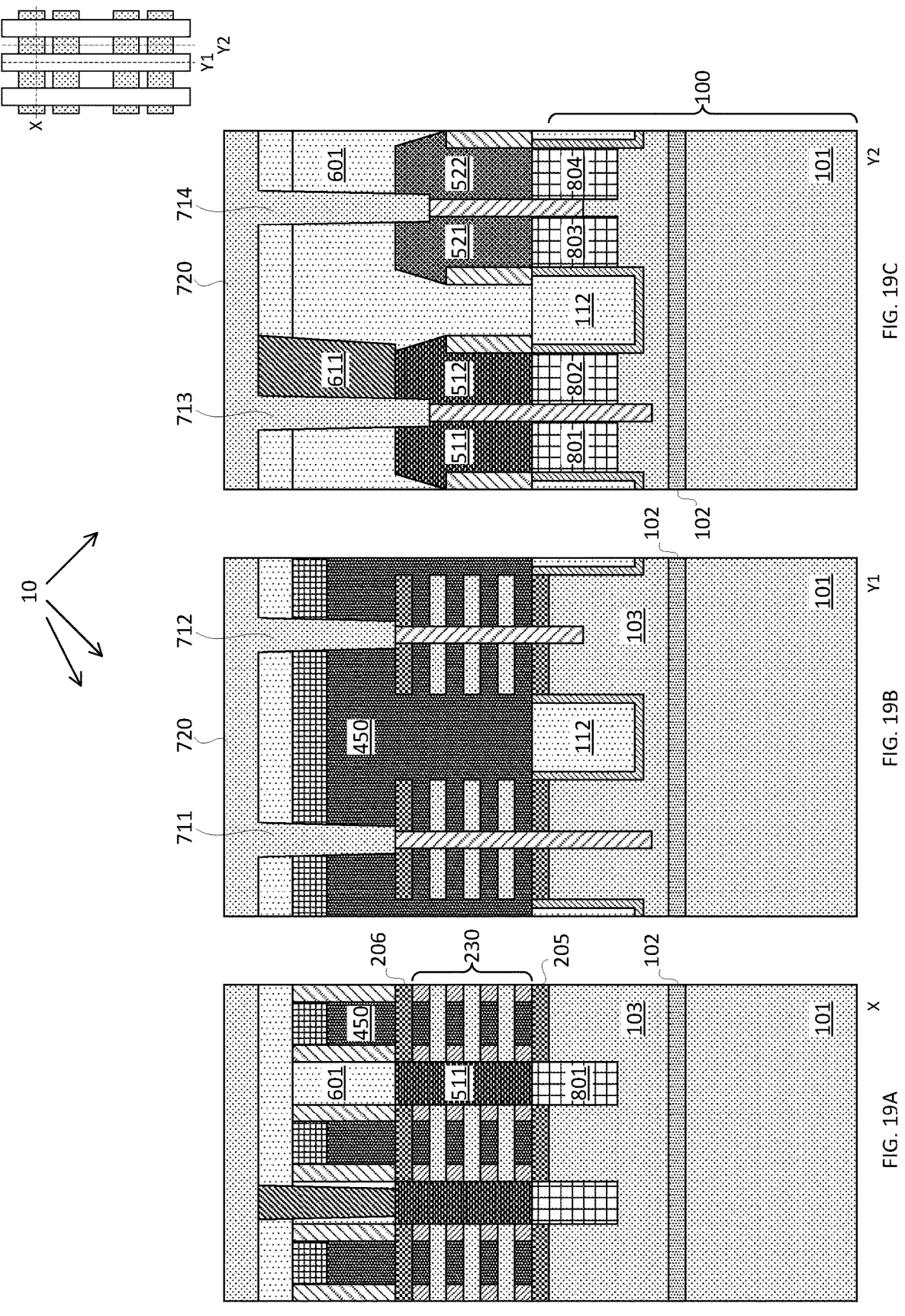

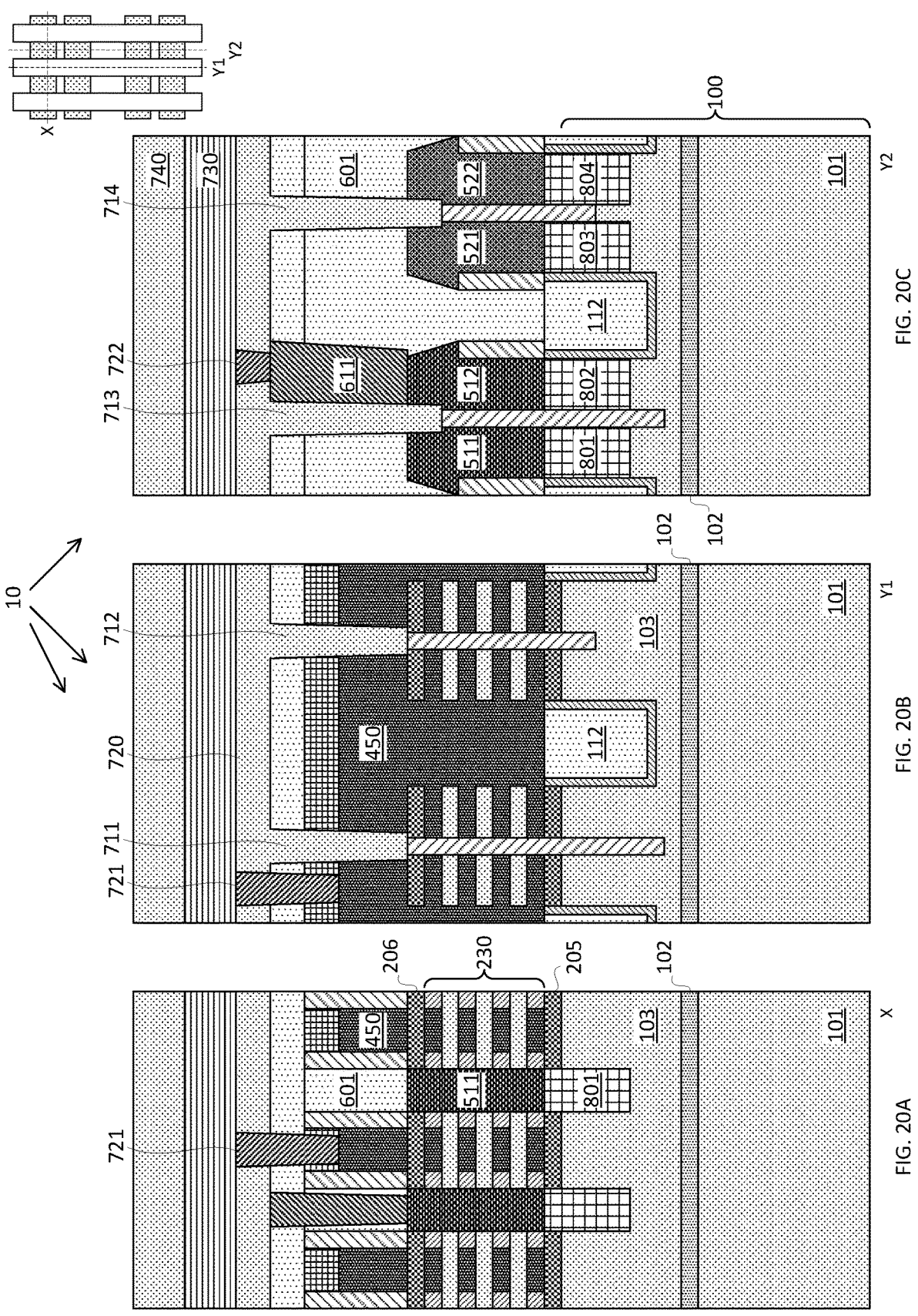

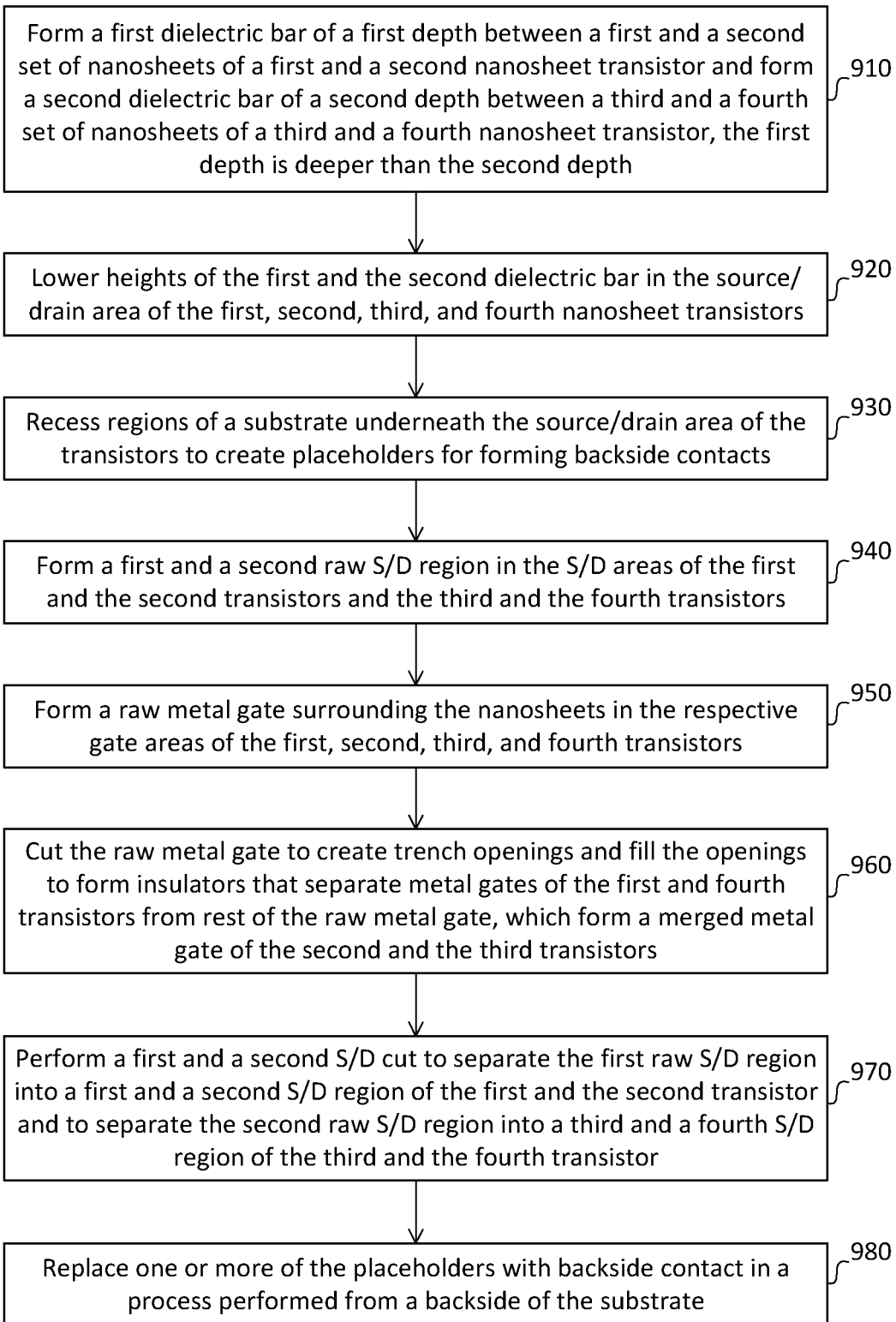

Form a first dielectric bar of a first depth between a first and a second set of nanosheets of a first and a second nanosheet transistor and form a second dielectric bar of a second depth between a third and a fourth set of nanosheets of a third and a fourth nanosheet transistor, the first depth is deeper than the second depth — 910

Lower heights of the first and the second dielectric bar in the source/ drain area of the first, second, third, and fourth nanosheet transistors — 920

Recess regions of a substrate underneath the source/drain area of the transistors to create placeholders for forming backside contacts — 930

Form a first and a second raw S/D region in the S/D areas of the first and the second transistors and the third and the fourth transistors — 940

Form a raw metal gate surrounding the nanosheets in the respective gate areas of the first, second, third, and fourth transistors — 950

Cut the raw metal gate to create trench openings and fill the openings to form insulators that separate metal gates of the first and fourth transistors from rest of the raw metal gate, which form a merged metal gate of the second and the third transistors — 960

Perform a first and a second S/D cut to separate the first raw S/D region into a first and a second S/D region of the first and the second transistor and to separate the second raw S/D region into a third and a fourth S/D region of the third and the fourth transistor — 970

Replace one or more of the placeholders with backside contact in a process performed from a backside of the substrate — 980

FIG. 27

FORKSHEET TRANSISTOR WITH ADVANCED CELL HEIGHT SCALING

BACKGROUND

The present application relates to manufacturing of semiconductor integrated circuits. More particularly, it relates to forming forksheet transistors with advanced cell height scaling.

As semiconductor industry moves towards smaller node, field-effect-transistors (FETs) have been aggressively scaled to fit into reduced footprint or real estate, which is often represented by the corresponding node size, with increased device density. Recently, forksheet transistors have been introduced to further reduce cell height where normally an n-type nanosheet FET (n-NSFET) and a p-type nanosheet FET (p-NSFET) are next to a left side and a right side of a vertical dielectric bar for reduced footprint. However, with this approach, backside power supply lines such as VDD and VSS wires may be placed too close to each other. Another current approach of implementing forksheet transistors is to place a vertical dielectric bar at cell boundaries (between n-NSFET and n-NSFET or between p-NSFET and p-NS-FET) instead. However, it still needs to address the formation of independent or shared backside contact at tight N2N or P2P space.

SUMMARY

Embodiments of present invention provide a semiconductor structure. The semiconductor structure includes a dielectric bar having a left sidewall and a right sidewall; a first nanosheet transistor having a first set of channel nanosheets in direct contact with the left sidewall of the dielectric bar; and a second nanosheet transistor having a second set of channel nanosheets in direct contact with the right sidewall of the dielectric bar, where a first portion of the dielectric bar between the first and the second set of channel nanosheets has a first height; a second portion of the dielectric bar between a first source/drain (S/D) region of the first nanosheet transistor and a second S/D region of the second nanosheet transistor has a second height; and the first height is higher than the second height. The lower height of the second portion of the dielectric bar enables a process of first forming a merged S/D region across the dielectric bar, which is then cut into the first S/D region of the first nanosheet transistor and the second S/D region of the second nanosheet transistor.

According to one embodiment, the semiconductor structure further includes a top dielectric insulator above the first and the second set of channel nanosheets and in direct contact with the left and the right sidewall of the dielectric bar, wherein the top dielectric insulator is surrounded by a gate of the first nanosheet transistor and a gate of the second nanosheet transistor. The top dielectric insulator serves as an etch-stop layer to enable a metal gate cutting process.

In one embodiment, the first S/D region of the first nanosheet transistor and the second S/D region of the second nanosheet transistor have a height higher than the second height of the second portion of the dielectric bar and are insulated from each other by a trench insulator in a S/D cut region directly above the dielectric bar. In one aspect, both the first and the second nanosheet transistor are either a p-type transistor or an n-type transistor.

In another embodiment, the dielectric bar is a first dielectric bar, further comprising a second dielectric bar between a third and a fourth nanosheet transistor, where the first dielectric bar has a first depth, the second dielectric bar has a second depth, and the first depth is deeper than the second depth.

According to one embodiment, the semiconductor structure further includes a backside contact surrounding a lower portion of the second dielectric bar and contacting both a bottom surface of a third S/D region of the third nanosheet transistor and a bottom surface of a fourth S/D region of the fourth nanosheet transistor.

According to another embodiment, the semiconductor structure further includes a backside contact contacting a bottom surface of the first S/D region of the first nanosheet transistor, where the second S/D region of the second nanosheet transistor is on top of a placeholder, and the placeholder is separated from the backside contact of the first S/D region of the first nanosheet transistor by the first dielectric bar.

Embodiments of present invention further provide a method of forming a semiconductor structure. The method includes forming a first dielectric bar between a first set of channel nanosheets of a first nanosheet transistor and a second set of channel nanosheets of a second nanosheet transistor and forming a second dielectric bar between a third set of channel nanosheets of a third nanosheet transistor and a fourth set of channel nanosheets of a fourth nanosheet transistor, the first dielectric bar has a first depth, the second dielectric bar has a second depth, and the first depth is deeper than the second depth; lowering a height of the first dielectric bar in a source/drain (S/D) area of the first and the second nanosheet transistors and lowering a height of the second dielectric bar at a S/D area of the third and the fourth nanosheet transistors; forming a first raw S/D region in the S/D area of the first and the second nanosheet transistors and forming a second raw S/D region in the S/D area of the third and the fourth nanosheet transistors; and performing a first S/D cut to separate the first raw S/D region into a first S/D region of the first nanosheet transistor and a second S/D region of the second nanosheet transistor and performing a second S/D cut to separate the second raw S/D region into a third S/D region of the third nanosheet transistor and a fourth S/D region of the fourth nanosheet transistor. This embodiment enables a process of first forming a merged S/D contact and subsequently cutting the merged S/D contact into two separate S/D contacts, which is generally more viable than forming two separate S/D contacts through a lithographic patterning and/or printing process.

According to one embodiment, the method further includes forming a raw metal gate surrounding the first, the second, the third, and the fourth set of channel nanosheets in a gate area of the first, the second, the third, and the fourth nanosheet transistor.

According to another embodiment, the method further includes performing a first gate cut to create a first gate cut region that separates a metal gate of the first nanosheet transistor from rest of the raw metal gate; and performing a second gate cut to create a second gate cut region that separates a metal gate of the fourth nanosheet transistor from rest of the raw metal gate.

According to yet another embodiment, the method further includes filling the first and the second gate cut region with a dielectric material to form a first and a second trench insulator, the first and the second trench insulator forming a first and a second cell boundary.

According to one embodiment, the method further includes creating a first and a second recess in a substrate below the S/D area of the first and the second nanosheet transistors and filling the first and the second recess with an epitaxial material to form a first and a second placeholder; and creating a third and a fourth recess in the substrate below the S/D area of the third and the fourth nanosheet transistors and filling the third and the fourth recess with an epitaxial material to form a third and a fourth placeholder.

According to another embodiment, the method further includes replacing one or more of the first, the second, the third, and the fourth placeholders with one or more backside contacts in a process performed from a backside of the substrate.

BRIEF DESCRIPTION OF THE DRAWINGS

The present invention will be understood and appreciated more fully from the following detailed description of embodiments of present invention, taken in conjunction with accompanying drawings of which:

FIGS. 1A, 1B, and 1C to FIGS. 26A, 26B, and 26C are demonstrative illustrations of different cross-sectional views of a semiconductor structure in various steps of manufacturing thereof according to embodiments of present invention; and FIG. 27 is a demonstrative illustration of a flow-chart of a method of manufacturing a semiconductor structure according to embodiments of present invention.

Figures 2A, 2B, 2C:
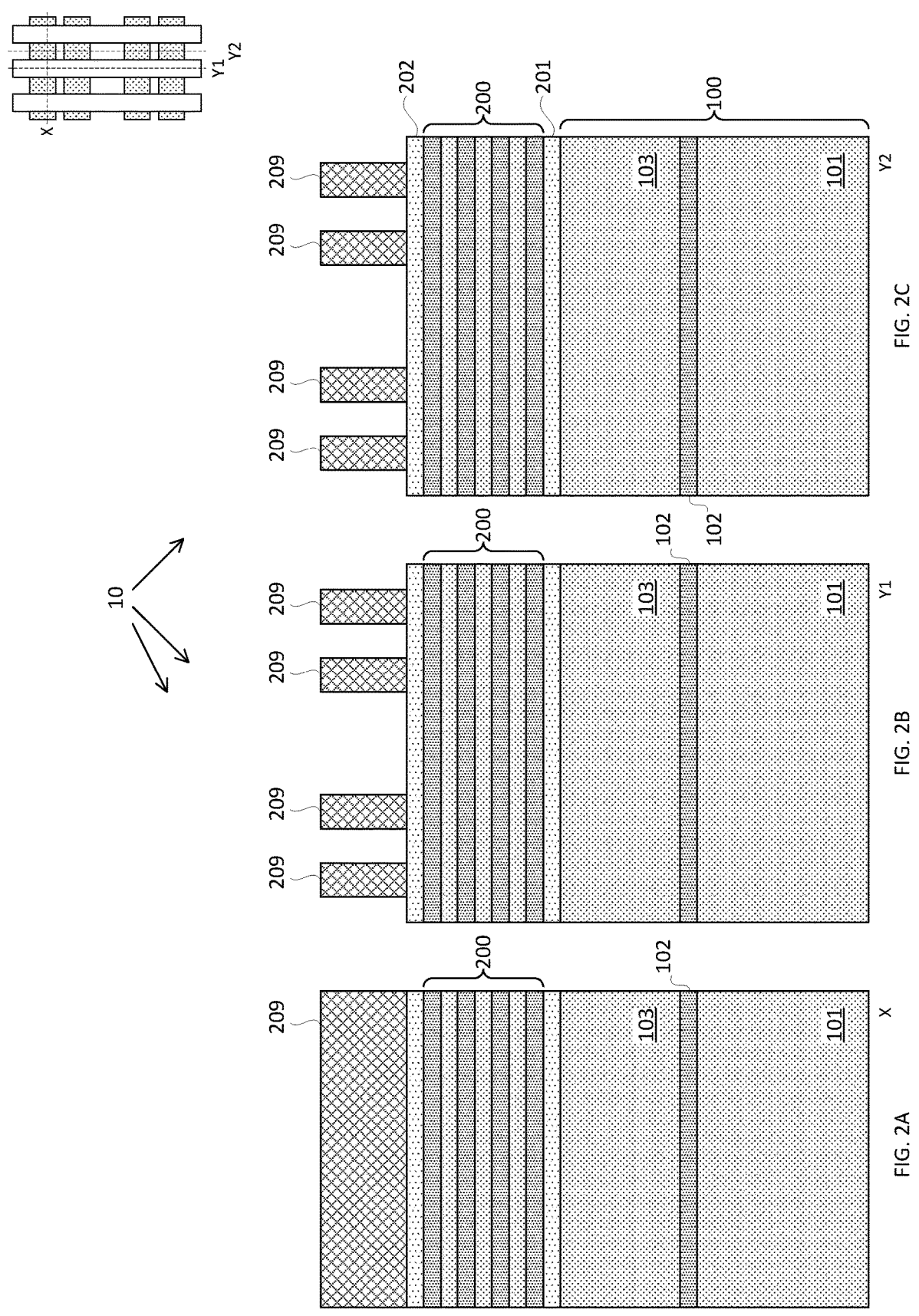

It will be appreciated that for simplicity and clarity purpose, elements shown in the drawings have not necessarily been drawn to scale. Further, and if applicable, in various functional block diagrams, two connected devices and/or elements may not necessarily be illustrated as being connected. In some other instances, grouping of certain elements in a functional block diagram may be solely for the purpose of description and may not necessarily imply that they are in a single physical entity, or they are embodied in a single physical entity.

DETAILED DESCRIPTION

In the below detailed description and the accompanying drawings, it is to be understood that various layers, structures, and regions shown in the drawings are both demonstrative and schematic illustrations thereof that are not drawn to scale. In addition, for the ease of explanation, one or more layers, structures, and regions of a type commonly used to form semiconductor devices or structures may not be explicitly shown in a given illustration or drawing. This does not imply that any layers, structures, and regions not explicitly shown are omitted from the actual semiconductor structures. Furthermore, it is to be understood that the embodiments discussed herein are not limited to the particular materials, features, and processing steps shown and described herein. In particular, with respect to semiconductor processing steps, it is to be emphasized that the descriptions provided herein are not intended to encompass all of the processing steps that may be required to form a functional semiconductor integrated circuit device. Rather, certain processing steps that are commonly used in forming semiconductor devices, such as, for example, wet cleaning and annealing steps, are purposefully not described herein for economy of description.

It is to be understood that the terms "about" or "substantially" as used herein with regard to thicknesses, widths, percentages, ranges, etc., are meant to denote being close or approximate to, but not exactly. For example, the term "about" or "substantially" as used herein implies that a small margin of error may be present such as, by way of example only, 1% or less than the stated amount. Likewise, the terms "on", "over", or "on top of" that are used herein to describe a positional relationship between two layers or structures are intended to be broadly construed and should not be interpreted as precluding the presence of one or more intervening layers or structures.

Moreover, although various reference numerals may be used across different drawings, the same or similar reference numbers are used throughout the drawings to denote the same or similar features, elements, or structures, and thus detailed explanations of the same or similar features, elements, or structures may not be repeated for each of the drawings for economy of description. Labelling for the same or similar elements in some drawings may be omitted as well in order not to overcrowd the drawings.

FIGS. 1A, 1B, and 1C are demonstrative illustrations of various cross-sectional views of a semiconductor structure in a step of manufacturing thereof according to one embodiment of present invention. At the up-right corner of the drawings, a simplified top view of the structure is provided for the purpose of showing locations of the various cross-sections illustrated in FIGS. 1A, 1B, and 1C. For that purpose, the simplified top view may only illustrate key features of the structure such as, for example, gate and various sets of nanosheets (already formed or to be formed) and may not necessarily illustrate details of all the elements of the structure.

More specifically, FIG. 1A illustrates a cross-sectional view of a semiconductor structure along a dashed line X as illustrated in the simplified top view. In other words, the cross-section illustrated in FIG. 1A is made across the gate in a direction along the length of the gate. FIG. 1B illustrates a cross-sectional view of the semiconductor structure along a dashed line Y1 as illustrated in the simplified top view. In other words, the cross-section illustrated in FIG. 1B is made across the gate in a direction along the width of the gate. FIG. 1C illustrates a cross-sectional view of the semiconductor structure along a dashed line Y2 as illustrated in the simplified top view. In other words, the cross-section illustrated in FIG. 1C is made across the source/drain region in a direction along the width of the gate. Likewise, FIGS. 2A, 2B, and 2C to FIGS. 26A, 26B, and 26C illustrate various cross-sectional views of the semiconductor structure, at different manufacturing stages, in manners similar to FIGS. 1A, 1B, and 1C respectively.

Reference is made back to FIGS. 1A, 1B, and 1C. Embodiments of present invention provide forming a semiconductor structure 10 such as a forksheet field-effect-transistor (FET) that may include multiple nanosheet transistors, although embodiments of present invention are not limited to nanosheet transistors and may be applied to other types of transistors and/or active devices as well.

More particularly, embodiments of present invention provide receiving or providing a semiconductor substrate 100 and forming a raw stack of nanosheets 200 on top of the semiconductor substrate 100. In one embodiment, the semiconductor substrate 100 may include a bulky silicon (Si) substrate 101; an etch-stop layer 102 on top of the Si substrate 101; and a Si layer 103 on top of the etch-stop layer 102, where the etch-stop layer 102 may be a silicon-germanium (SiGe) layer. In another embodiment, the semiconductor substrate 100 may be a silicon-on-insulator (SOI) substrate where the etch-stop layer 102 is a dielectric layer such as, for example, a silicon-nitride (SiN) layer or a silicon-oxide ($SiO_2$) layer. With the etch-stop layer 102 being a layer of material different from the Si substrate 101 as well as the Si layer 103, the etch-stop layer 102 enables a selective etch or removal process as being described and made clear later in more details.

Before forming the raw stack of nanosheets 200, a first raw sacrificial SiGe layer 201 may be formed on top of the Si layer 103. The first raw sacrificial SiGe layer 201 may be a placeholder layer formed here for forming a bottom dielectric insulator at a later stage. The first raw sacrificial SiGe layer 201 may contain a Ge concentration level of about, for example, 55 at. % and may thus be referred to as a SiGe55 layer as well. Next, the raw stack of nanosheets 200 may be formed on top of the first raw sacrificial SiGe layer 201. The raw stack of nanosheets 200 may include a raw stack of Si nanosheets separated by or alternating with a raw stack of sacrificial sheets. The raw stack of sacrificial sheets may be a raw stack of SiGe sheets that contain a Ge concentration level of about, for example, 25 at. % and may thus be referred to as a raw stack of SiGe25 sheets. On top of the raw stack of nanosheets 200, a second raw sacrificial SiGe layer 202 may be formed. Like the first raw sacrificial SiGe layer 201, the second raw sacrificial SiGe layer 202 may be a placeholder layer formed here for forming a top dielectric insulator at a later stage and may be a SiGe55 layer as well containing a Ge concentration level of about 55 at. %.

FIGS. 2A, 2B, and 2C are demonstrative illustrations of different cross-sectional views of a semiconductor structure in a step of manufacturing thereof according to one embodiment of present invention. More particularly, following the step illustrated in FIGS. 1A, 1B, and 1C, embodiments of present invention provide forming a hard mask 209 on top of the second raw sacrificial SiGe layer 202. The hard mask 209 may be made of, for example, SiN, SiO$_2$, or other suitable materials and may be formed through a lithographic patterning process. The hard mask 209 may have a pattern of one or more long strips and may be used, in a subsequent step via a selective etch process, to pattern the raw stack of nanosheets 200 into one or more stacks of nanosheets. The one or more stacks of nanosheets may eventually be formed into one or more nanosheet transistors.

Figures 3A, 3B, 3C:
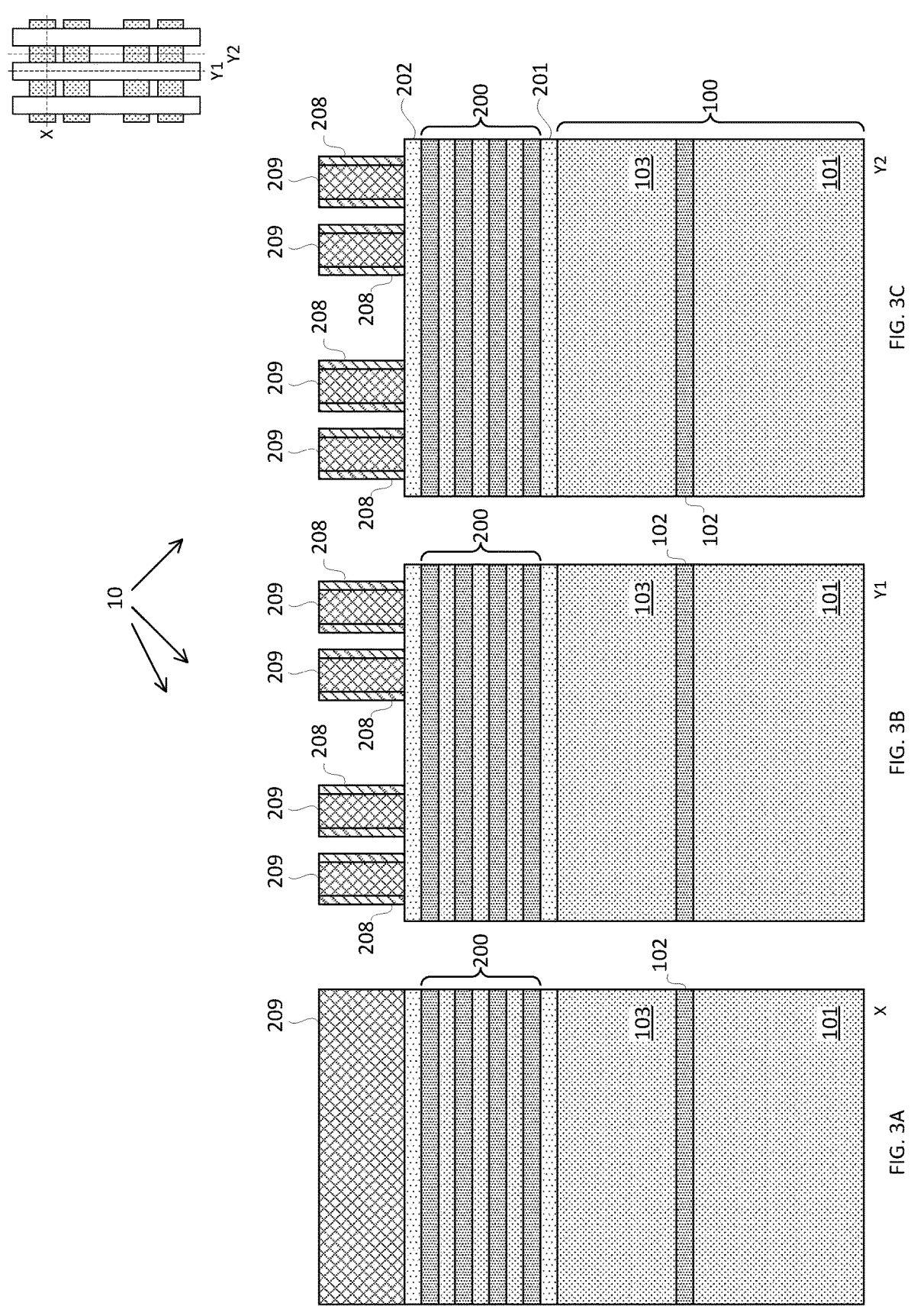

FIGS. 3A, 3B, and 3C are demonstrative illustrations of different cross-sectional views of a semiconductor structure in a step of manufacturing thereof according to one embodiment of present invention. More particularly, following the step illustrated in FIGS. 2A, 2B, and 2C, embodiments of present invention provide modifying the hard mask 209, optionally, to narrow gaps or spaces between the strips of the hard mask 209. For example, embodiments of present invention provide forming sidewall spacers 208 at sidewalls of the strips of the hard mask 209 thereby resulting the gaps or spaces between the strips of the hard mask 209 being narrowed by an amount approximately equal to twice a thickness of the sidewall spacers 208.

In forming the sidewall spacers 208, a conformal dielectric layer such as, for example, SiN or SiO$_2$ may first be formed to line the strips of the hard mask 209. The conformal dielectric layer may cover portions of the second raw sacrificial SiGe layer 202 as well that are not covered by the hard mask 209. The conformal dielectric layer may be formed through a deposition process such as, for example, an atomic layer deposition (ALD) process, a chemical vapor deposition (CVD) process, a physical vapor deposition (PVD) process, or other currently existing or future developed processes. Next, a directional or anisotropic etching process, such as a reactive-ion-etch (RIE) process, may be applied to remove horizontal portions of the conformal dielectric layer, leaving vertical portions of the conformal dielectric layer at the gaps or spaces next to sidewalls of the strips of the hard mask 209 to form the sidewall spacers 208.

FIGS. 4A, 4B, and 4C are demonstrative illustrations of different cross-sectional views of a semiconductor structure in a step of manufacturing thereof according to one embodiment of present invention. More particularly, following the step illustrated in FIGS. 3A, 3B, and 3C, embodiments of present invention provide transferring the pattern of the hard mask 209 and the sidewall spacers 208 onto the raw stack of nanosheets 200 through, for example, a selective etching process thereby forming one or more stacks of nanosheets 210. The process of forming the one or more stacks of nanosheets 210 may also pattern the first raw sacrificial SiGe layer 201 into a first sacrificial SiGe layer 203 and the second raw sacrificial SiGe layer 202 into a second sacrificial SiGe layer 204. The process may also etch into the Si layer 103, at least partially, underneath the first raw sacrificial SiGe layer 201.

The process of forming the one or more stacks of nanosheets 210 may thus create a first opening 251 between a first pair 261 of the stacks of nanosheets 210, which may be used in forming a first pair 271 of nanosheet transistors and create a second opening 252 between a second pair 262 of the stacks of nanosheets 210, which may be used in forming a second pair 272 of nanosheet transistors. The process may create a third opening 253 between the first pair 261 and the second pair 262 of the stacks of nanosheets 210. Because the first and the second opening 251 and 252 have an opening that is much smaller or has a width that is much narrower than that of the third opening 253, the third opening 253 may be etched deeper into the Si layer 103 than the first and the second opening 251 and 252 due to RIE lag. In other words, the first and the second opening 251 and 252 may be etched shallower into the Si layer 103 than the third opening 253.

Figures 5A, 5B, 5C:
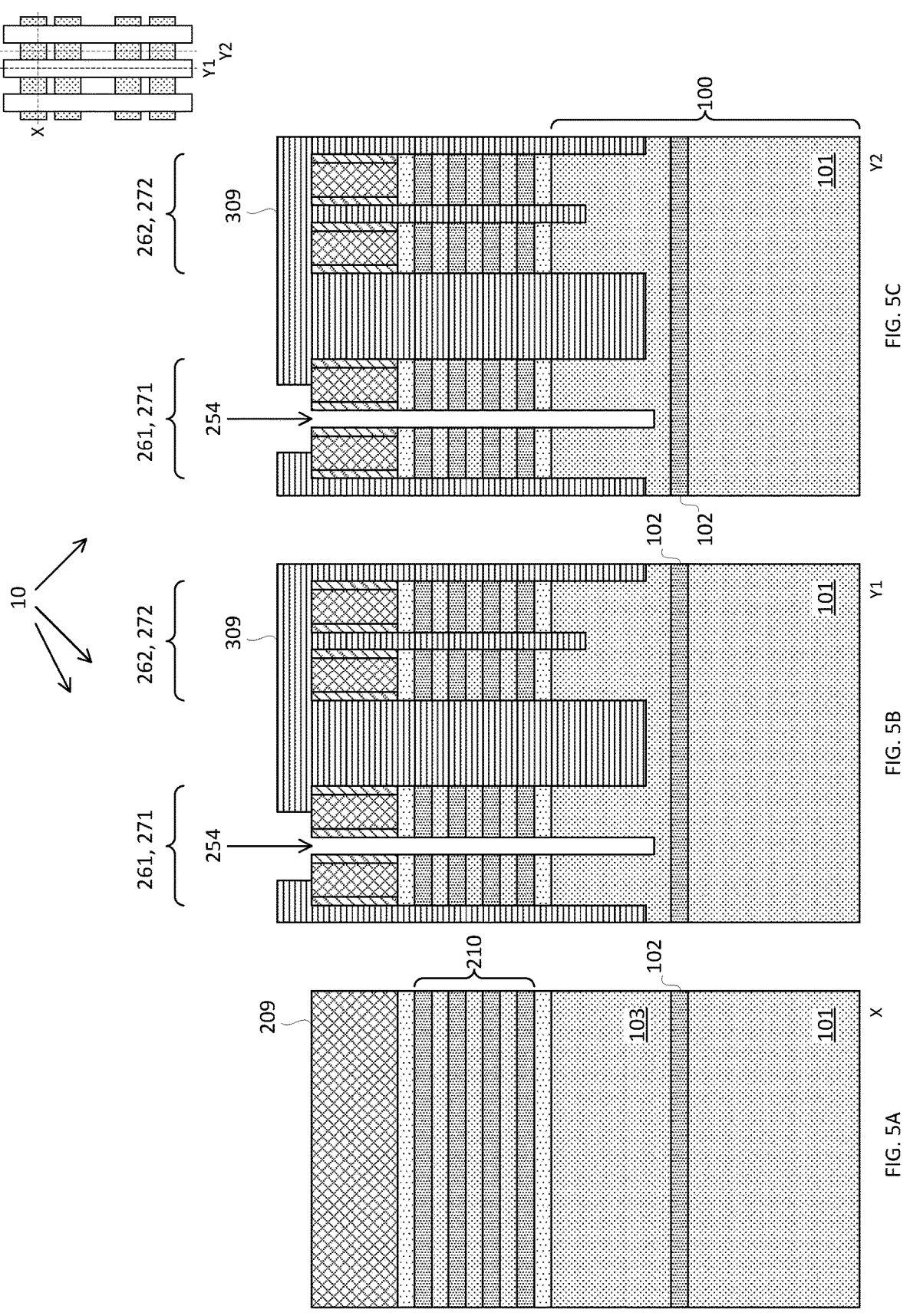

FIGS. 5A, 5B, and 5C are demonstrative illustrations of different cross-sectional views of a semiconductor structure in a step of manufacturing thereof according to one embodiment of present invention. More particularly, following the step illustrated in FIGS. 4A, 4B, and 4C, embodiments of present invention provide covering the second opening 252 and the third opening 253 with an organic planarization layer (OPL) mask 309 while keeping the first opening 251 exposed for further processing. For example, an OPL layer may first be formed to blanketly cover the one or more stacks of nanosheets 210. The OPL layer may then be patterned into the OPL mask 309, for example through a lithographic patterning process, with an opening that exposes the first opening 251. The exposed first opening 251 may then be further etched to become an enhanced first opening 254 having a depth that is deeper than the second opening 252. As being described below in more details, the creation of the enhanced first opening 254 may help create a deeper dielectric bar for process enhancement. After creating the enhanced first opening 254, the OPL mask 309 may be lifted or removed through, for example, an ash process or other selective etch processes.

Figures 6A, 6B, 6C:
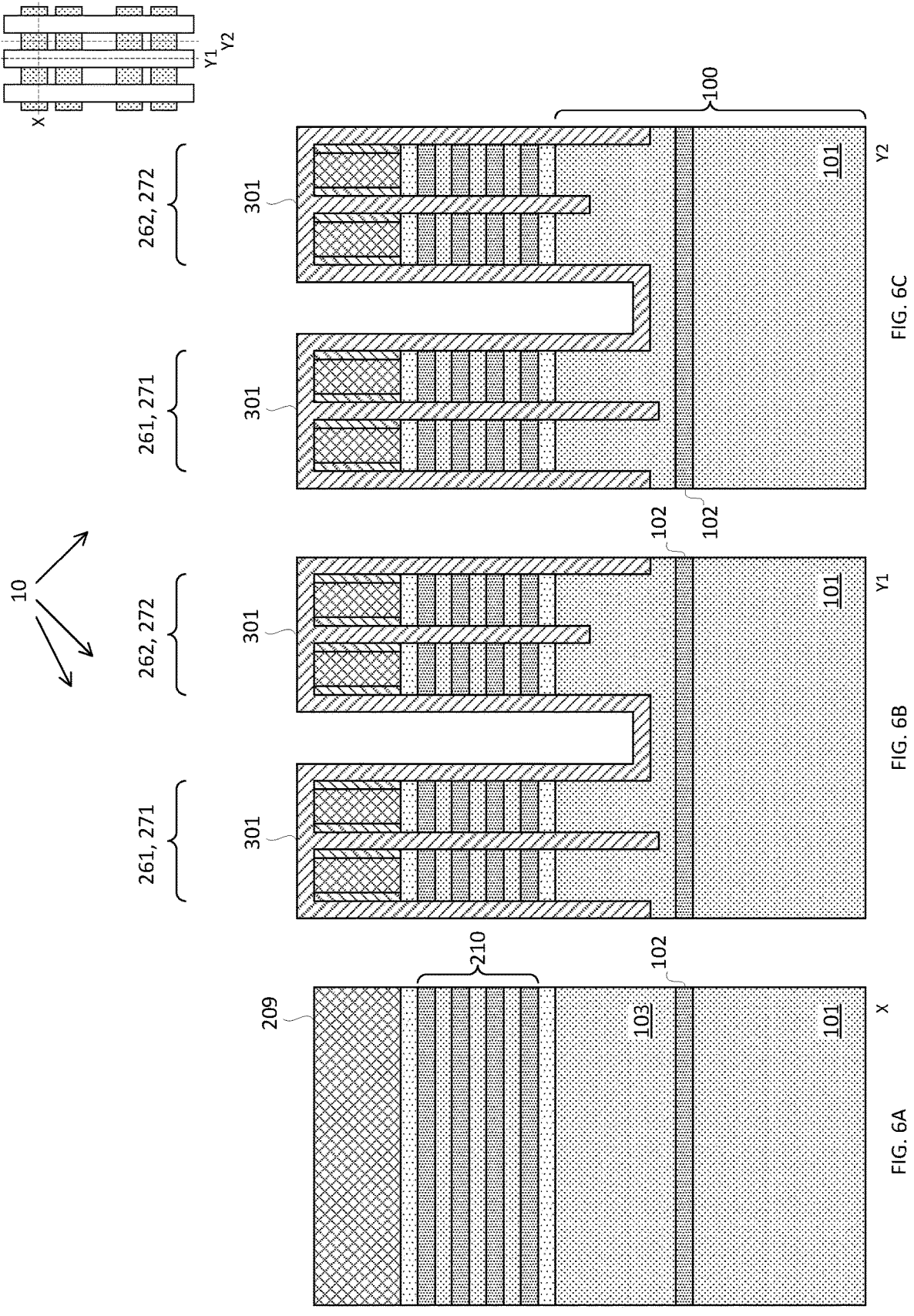

FIGS. 6A, 6B, and 6C are demonstrative illustrations of different cross-sectional views of a semiconductor structure in a step of manufacturing thereof according to one embodiment of present invention. More particularly, following the step illustrated in FIGS. 5A, 5B, and 5C, embodiments of present invention provide forming a conformal dielectric liner 301 that fully fills the enhanced first opening 254 and the second opening 252 through a pinch-off process of the conformal dielectric liner 301. The dielectric liner 301 may also line sidewalls of the third opening 253; line outer sidewalls of the first pair 261 of the stacks of nanosheets 210; and line outer sidewalls of the second pair 262 of the stacks of nanosheets 210.

In one embodiment, the conformal dielectric liner 301 may be formed through the ALD process, which may be particularly suitable for filling up openings of high aspect ratio such as the enhanced first opening 254 and the second opening 252. However, embodiments of present invention are not limited in this aspect and other processes such as a CVD process, a PVD process, or other currently existing or future developed process may be used as well.

FIGS. 7A, 7B, and 7C are demonstrative illustrations of different cross-sectional views of a semiconductor structure in a step of manufacturing thereof according to one embodiment of present invention. More particularly, following the step illustrated in FIGS. 6A, 6B, and 6C, embodiments of present invention provide applying an isotropic etching process to etch the dielectric liner 301 such that most, but not all, of the dielectric liner 301 may be removed. The remaining portions of the dielectric liner 301 may include, for example, a first portion between the first pair 261 of the stacks of nanosheets 210 and a second portion between the second pair 262 of the stacks of nanosheets 210. The first portion may form a first dielectric bar 311 at a first cell boundary and the second portion may form a second dielectric bar 312 at a second cell boundary. The first and the second dielectric bar 311 and 312 may have a top surface that is slightly below the top surface of the hard mask 209 but above the second sacrificial SiGe layer 204.

FIGS. 8A, 8B, and 8C are demonstrative illustrations of different cross-sectional views of a semiconductor structure in a step of manufacturing thereof according to one embodiment of present invention. More particularly, following the step illustrated in FIGS. 7A, 7B, and 7C, embodiments of present invention provide selectively removing and replacing the first and the second sacrificial SiGe layer 203 and 204 with a dielectric material to form a bottom dielectric insulator (BDI) 205 and a top dielectric insulator (TDI) 206. The BDI 205 and the TDI 206 provide electrical isolation of the one or more stacks of nanosheets 210 from the Si layer 103 underneath thereof and from structures to be formed on top thereof.

FIGS. 9A, 9B, and 9C are demonstrative illustrations of different cross-sectional views of a semiconductor structure in a step of manufacturing thereof according to one embodiment of present invention. More particularly, following the step illustrated in FIGS. 8A, 8B, and 8C, embodiments of present invention provide forming a shallow trench isolation (STI) in the Si layer 103 between the one or more stacks of nanosheets 210, particularly between the stacks of nanosheets 210 of the first pair 261 and between the stacks of nanosheets 210 of the second pair 262. For example, embodiments of present invention provide forming an STI 110 by first depositing a dielectric liner 111 lining sidewalls and a bottom surface of the third opening 253; depositing a dielectric filler 112 on top of the dielectric liner 111; and applying a selective etch process to recess the dielectric liner 111 and the dielectric filler 112 so as to expose sidewalls of the one or more stacks of nanosheets 210. In other words, the STI 110 may be recessed to have a top surface whose level is at or below the BDI 205.

Following the formation of the STI 110, the hard mask 209 and the sidewall spacers 208 that are on top of the one or more stacks of nanosheets 210 may be removed. The removal may be made through, for example, an ash process or other selective etch process. The removal of the hard mask 209 and the sidewall spacers 208 may reveal or expose top surfaces of the TDI 206 as well as a portion of the first dielectric bar 311 and a portion of the second dielectric bar 312 that are above the TDI 206.

FIGS. 10A, 10B, and 10C are demonstrative illustrations of different cross-sectional views of a semiconductor structure in a step of manufacturing thereof according to one embodiment of present invention. More particularly, following the step illustrated in FIGS. 9A, 9B, and 9C, embodiments of present invention provide forming one or more dummy gates to cover portions of the stacks of nanosheets 210. More particularly, embodiments of present invention provide forming a layer of dummy gate material such as, for example, amorphous silicon (a-Si) on top of the one or more stacks of nanosheets 210; forming a gate mask 402 on top of the layer of dummy gate material; and applying the gate mask 402 in a selective etching process to etch the layer of dummy gate material into one or more dummy gates 401.

Figures 11A, 11B, 11C:
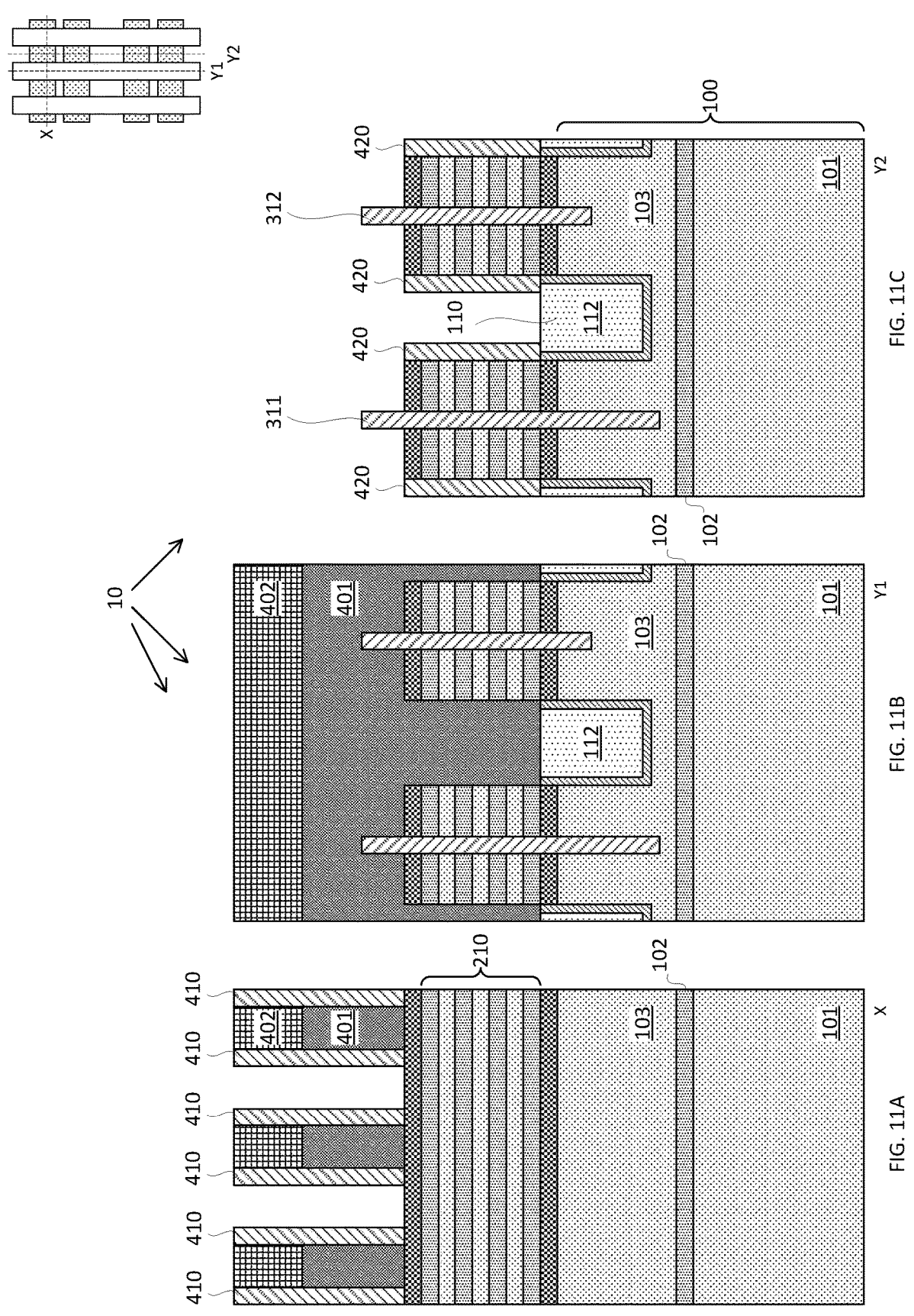

FIGS. 11A, 11B, and 11C are demonstrative illustrations of different cross-sectional views of a semiconductor structure in a step of manufacturing thereof according to one embodiment of present invention. More particularly, following the step illustrated in FIGS. 10A, 10B, and 10C, embodiments of present invention provide forming sidewall spacers 410 at sidewalls of the one or more dummy gates 401. In one embodiment, the sidewall spacers 410 may be formed by first forming a conformal dielectric layer that covers top surfaces and sidewalls of the one or more dummy gates 401. Next, a directional or anisotropic etch process may be applied to remove horizontal portions of the conformal dielectric layer, thereby leaving only vertical portions of the conformal dielectric layer at sidewalls of the one or more dummy gates 401 to form the sidewall spacers 410. The sidewall spacers 410 cover sidewalls of the one or more dummy gates 401 as well as the gate mask 402 on top thereof.

The process of forming the sidewall spacers 410 may also form sidewall spacers 420 at the exposed sidewalls of the one or more stacks of nanosheets 210, as is demonstratively illustrated in FIG. 11C in the source/drain (S/D) areas of the first pair 271 of nanosheet transistors and the second pair 272 of nanosheet transistors, where the one or more stacks of nanosheets 210 are not covered by the one or more dummy gates 401.

Figures 12A, 12B, 12C:
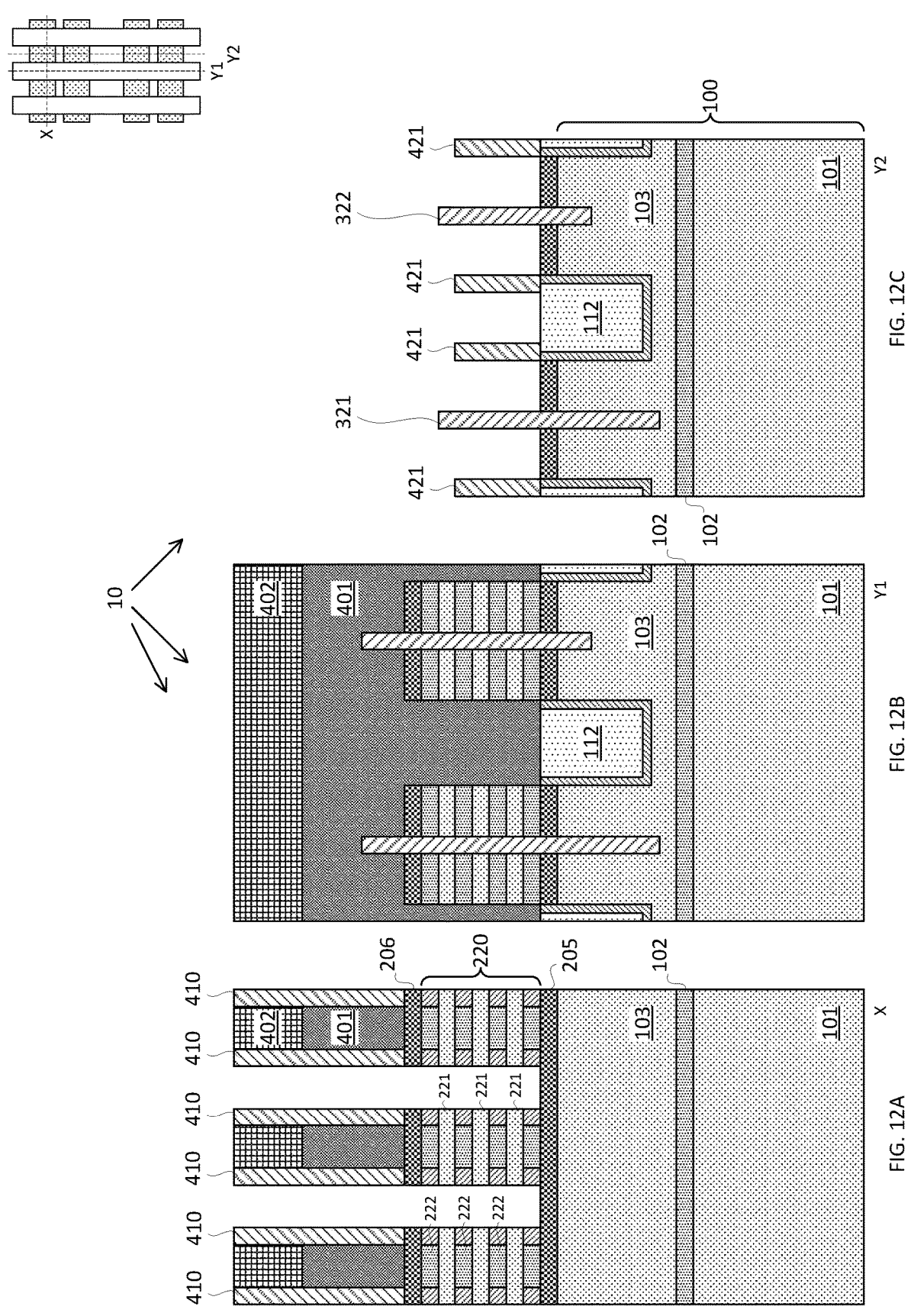

FIGS. 12A, 12B, and 12C are demonstrative illustrations of different cross-sectional views of a semiconductor structure in a step of manufacturing thereof according to one embodiment of present invention. More particularly, following the step illustrated in FIGS. 11A, 11B, and 11C, embodiments of present invention provide recessing or removing the TDI 206 and the one or more stacks of nanosheets 210 between the one or more dummy gates 401. The recessing or removing may be made through a selective etch process, using the one or more dummy gates 401 as an etch mask, until the BDI 205 is exposed. The selective etch process transforms or patterns the one or more stacks of nanosheets 210 into one or more sets of nanosheets 220 that are used in forming one or more nanosheet transistors including the first pair 271 and the second pair 272 of nanosheet transistors. The one or more sets of nanosheets 220 may each include a set of Si nanosheets 221 alternating with a set of sacrificial sheets 222. The Si nanosheet 221 may be known as channel nanosheet and the set of Si nanosheets 221 may also be known as a set of channel nanosheets.

Embodiments of present invention provide further recessing the set of sacrificial sheets 222 in each of the set of nanosheets 220. Openings or recesses may be created at the ends of the set of sacrificial sheets 222. Next, inner spacers may be formed through a conformal deposition process of dielectric material, followed by a directional etch process, in the created openings or recesses.

Here, it is to be noted that portions of the first and the second dielectric bar 311 and 312 as well as sidewall spacers 420, in the S/D areas as is illustrated in FIG. 11C, may be etched to certain extent during the removal of the TDI 206 and subsequent recessing of the one or more stacks of nanosheets 210. This may result in the first and the second dielectric bar 311 and 312 having reduced height to become modified first dielectric bar 321 and modified second dielectric bar 322. For example, the modified first and the modified second dielectric bar 321 and 322 may have a height that is at or below the upper most Si nanosheet 221, or channel nanosheet, of the set of nanosheets 220. The lowering of the height of the first and the second dielectric bar 311 and 312 may cause the subsequently formed S/D regions of the first pair 271 of nanosheet transistors to merge together, and the subsequently formed S/D regions of the second pair 272 of nanosheet transistors to merge as well, as being described below in more details. Since the pair of transistors, whether the first pair 271 and the second pair 272, are to be formed as a same type of transistors, the merge of their S/D regions during process poses no issues, as compared with a pair of different types of transistors.

FIGS. 13A, 13B, and 13C are demonstrative illustrations of different cross-sectional views of a semiconductor structure in a step of manufacturing thereof according to one embodiment of present invention. More particularly, following the step illustrated in FIGS. 12A, 12B, and 12C, embodiments of present invention provide selectively removing the exposed portions of the BDI 205 between the one or more dummy gates 401; removing a portion of the Si layer 103 exposed by the removal of the BDI 205 to create recesses; and forming one or more placeholders, such as placeholder 801, 802, 803, and 804 in the created recesses in the Si layer 103. In one embodiment, the placeholders 801, 802, 803, and 804 may be formed through an epitaxially growing process to contain epitaxially grown SiGe.

Embodiments of present invention provide proceeding to form one or more sets of raw S/D regions in the S/D areas between the one or more dummy gates 401. For example, a first raw S/D region 510 may be formed at the S/D area for the first pair 271 of nanosheet transistors, and a second raw S/D region 520 may be formed in the S/D area for the second pair 272 of nanosheet transistors. In one embodiment, the first pair 271 of nanosheet transistors may be a first type of transistors, such as an n-type (or a p-type), and the second pair 272 of nanosheet transistors may be a second type of transistors, such as a p-type (or an n-type), and the first type is different from the second type. In other words, the first pair 271 of nanosheet transistors are a type of transistors different from the second pair 272 of nanosheet transistors. Correspondingly, the first raw S/D region 510 may be, for example, an n-type S/D region and the second raw S/D region 520 may be, for example, a p-type S/D region.

Because the height of the modified first dielectric bar 321 and the modified second dielectric bar 322 are at or below the top Si nanosheet 221 of the set of nanosheets 220, the first raw S/D region 510 for the first pair 271 of nanosheet transistors may merge together at the top of the modified first dielectric bar 321. Similarly, the second raw S/D region 520 of the second pair 272 of nanosheet transistors may merge together at the top of the modified second dielectric bar 322. No epitaxial growth may happen between the first pair 271 and the second pair 272 of nanosheet transistors because no Si or SiGe epitaxial growth will happen from the surface of dielectric material such as that of the dielectric filler 112 or the dielectric sidewall spacers 420.

As is illustrated in FIG. 13B, the first and the second dielectric bar 311 and 312 in the area of dummy gate 401 may respectively have a left sidewall and a right sidewall. The first pair 261 of the sets of nanosheets 220 may include a first set of channel nanosheets 2611 that is in direct contact with the left sidewall of the first dielectric bar 311, and a second set of channel nanosheets 2612 that is in direct contact with the right sidewall of the first dielectric bar 311. Similarly, the second pair 262 of the sets of nanosheets 220 may include a third set of channel nanosheets 2621 that is in direct contact with the left sidewall of the second dielectric bar 312, and a fourth set of channel nanosheets 2622 that is in direct contact with the right sidewall of the second dielectric bar 312.

Furthermore, as are illustrated in FIG. 13B and FIG. 13C, the first dielectric bar 311 may have a first depth D1 and the second dielectric bar 312 may have a second depth D2, with both being measured from, for example, a top surface of the BDI 205 and the first depth D1 being deeper than the second depth D2. Measured from the same top surface of the BDI 205, the first dielectric bar 311 (and the second dielectric bar 312) in the area of the dummy gate 401 may have a first height H1, the first dielectric bar 321 (and the second dielectric bar 322) in the source/drain area may have a second height H2, and the first height H1 may be higher than the second height H2. Moreover, the first and the second raw S/D region 510 and 520 may be formed to have a height H0, measured from the top surface of the BDI 205, that is higher than the second height H2 of the modified first and the modified second dielectric bar 321 and 322. The depths and/or the heights may be measured from any other common reference level and the top surface of the BDI 205 used here is merely a non-limiting sample reference.

Figures 14A, 14B, 14C:
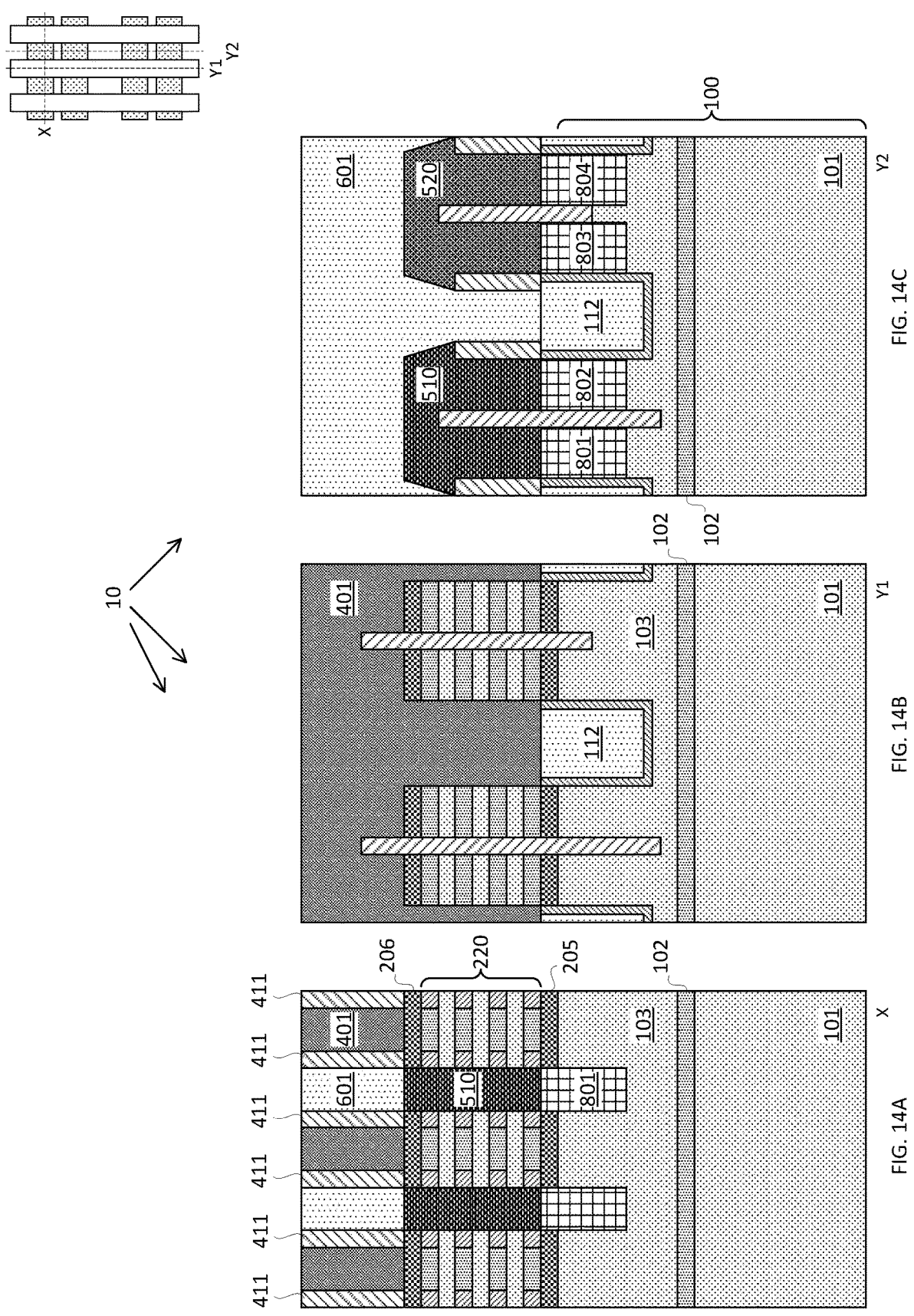

FIGS. 14A, 14B, and 14C are demonstrative illustrations of different cross-sectional views of a semiconductor structure in a step of manufacturing thereof according to one embodiment of present invention. More particularly, following the step illustrated in FIGS. 13A, 13B, and 13C, embodiments of present invention provide forming an interlevel dielectric (ILD) layer 601 on top of the first and the second raw S/D regions 510 and 520 between the one or more dummy gates 401. Subsequently the gate mask 402, together with a portion of the sidewall spacers 410 and a portion of the ILD layer 601, may be removed through for example a chemical-mechanical-polishing (CMP) process, thereby resulting in the one or more dummy gates 401 being exposed at the top. Sidewalls of the one or more dummy gates 401 may be covered by sidewall spacers 411, which are portions of the sidewall spacers 410.

Figures 15A, 15B, 15C:
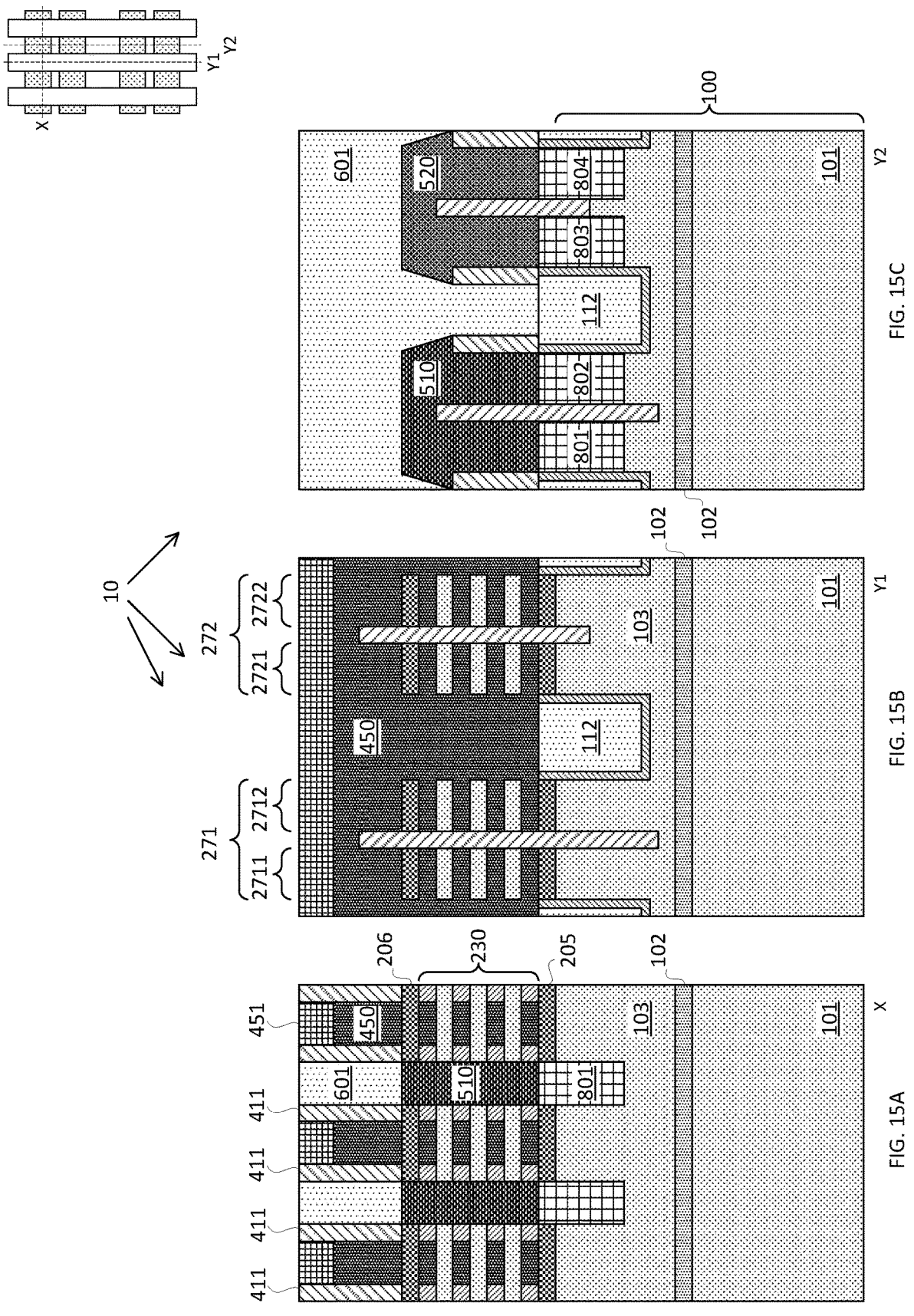

FIGS. 15A, 15B, and 15C are demonstrative illustrations of different cross-sectional views of a semiconductor structure in a step of manufacturing thereof according to one embodiment of present invention. More particularly, following the step illustrated in FIGS. 14A, 14B, and 14C, embodiments of present invention provide forming one or more raw metal gates 450 through a replacement-metal-gate (RMG) process surrounding the set of Si nanosheets 221 of channel nanosheets of the one or more sets of nanosheets 220. More particularly, embodiments of present invention provide selectively removing the one or more dummy gates 401 to expose the one or more sets of nanosheets 220 and, removing selectively the set of sacrificial sheets 222 that alternates with or separates the set of Si nanosheets 221 of channel nanosheets, thereby creating openings surrounding the set of Si nanosheets 221 of channel nanosheets in each set of nanosheets 220.

Next, the one or more raw metal gates 450 may be formed by first forming a gate-dielectric layer surrounding the exposed set of Si nanosheets 221; forming one or more work-function-metal layers on top of the gate dielectric layer; and forming one or more layers of conductive material such as, for example, aluminum (Al), tungsten (W), ruthenium (Ru) or other suitable materials on top of the one or more work-function metal layers thereby forming the one or more raw metal gates 450. Following the formation of the raw metal gates 450, a top portion thereof may be recessed to created recesses, which may subsequently be filled with a dielectric material to form a dielectric cap layer 451. The raw metal gate 450 may be formed for the first pair 271 of nanosheet transistors including a first nanosheet transistor 2711 and a second nanosheet transistor 2712; and may be formed for the second pair 272 of nanosheet transistors including a third nanosheet transistor 2721 and a fourth nanosheet transistor 2722.

Figures 16A, 16B, 16C:
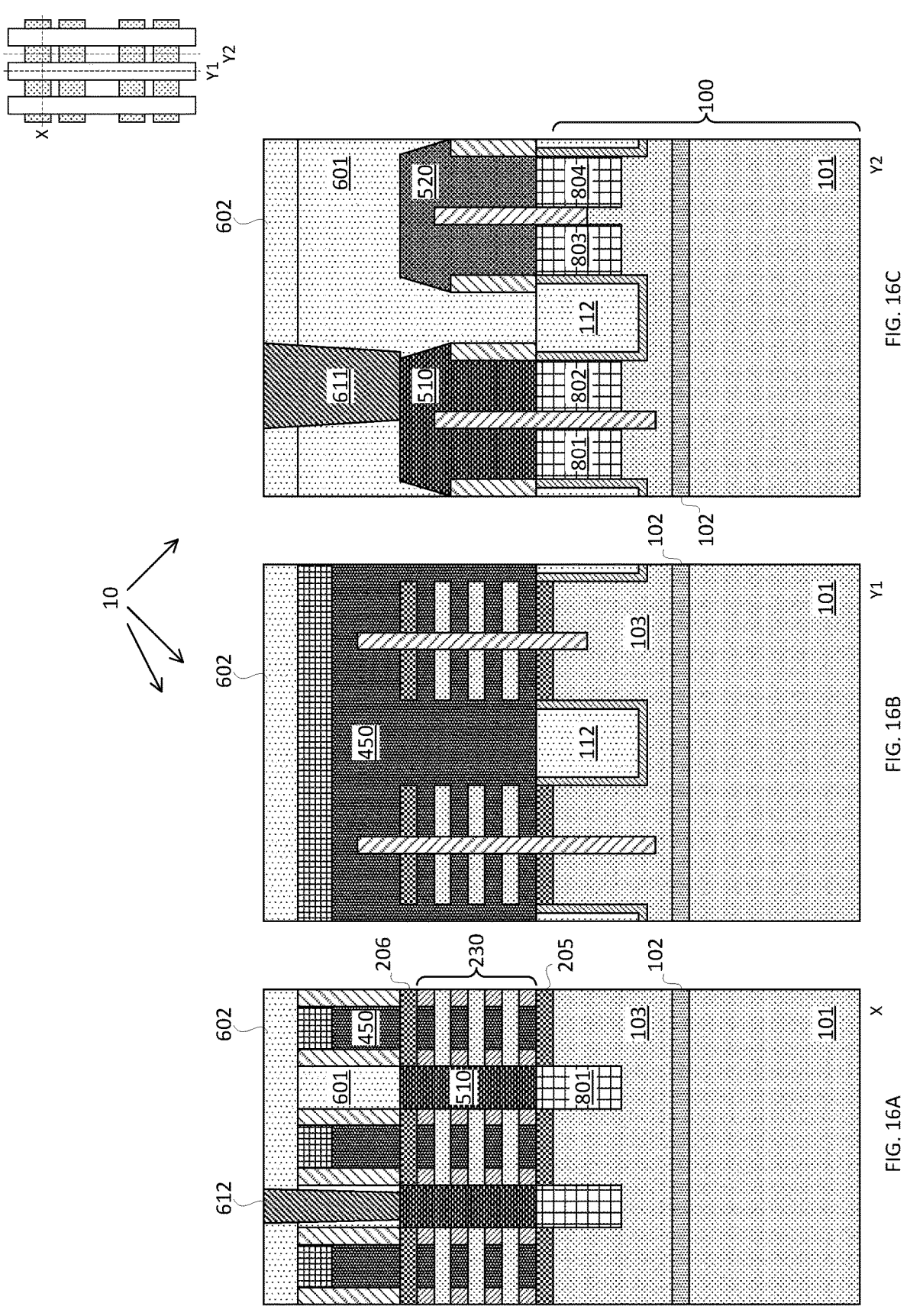

FIGS. 16A, 16B, and 16C are demonstrative illustrations of different cross-sectional views of a semiconductor structure in a step of manufacturing thereof according to one embodiment of present invention. More particularly, following the step illustrated in FIGS. 15A, 15B, and 15C, embodiments of present invention provide forming an ILD layer 602 on top of the dielectric cap layer 451 to cover the one or more raw metal gates 450 as well as on top of the ILD layer 601. One or more openings may be created in the ILD layer 602, and through the ILD layer 601, to expose S/D regions of the first pair 271 and the second pair 272 of nanosheet transistors. The openings may then be filled with conductive material to form S/D contacts. As a non-limiting example, openings may be created to expose S/D regions of the first pair 271 of nanosheet transistors and the openings are subsequently filled with conductive materials to form S/D contacts 611 and 612.

Figures 17A, 17B, 17C:
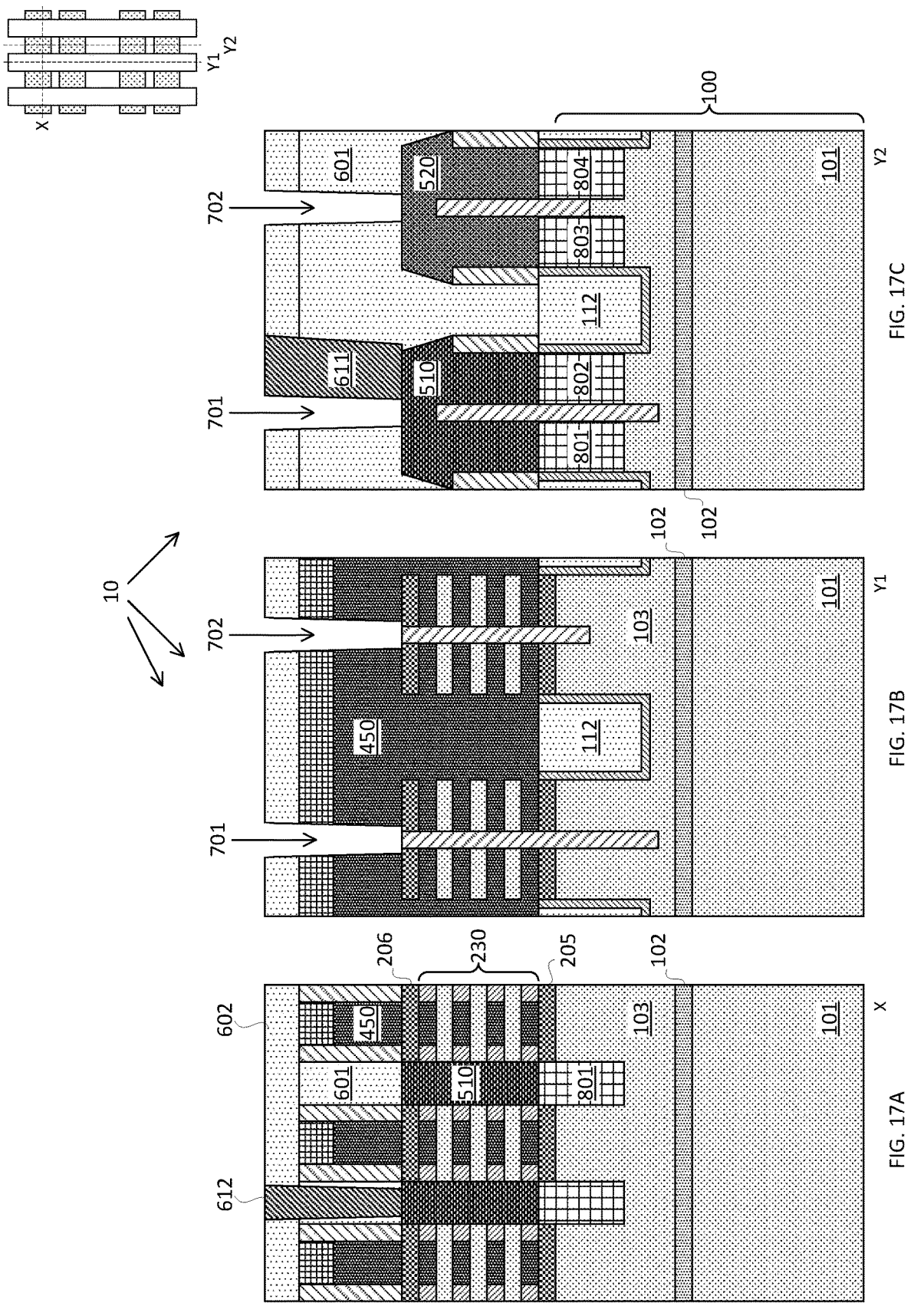

FIGS. 17A, 17B, and 17C are demonstrative illustrations of different cross-sectional views of a semiconductor structure in a step of manufacturing thereof according to one embodiment of present invention. More particularly, following the step illustrated in FIGS. 16A, 16B, and 16C, embodiments of present invention provide performing a first gate cut and a first S/D cut at locations that are substantially aligned with the first dielectric bar 311 and the modified first dielectric bar 321 and performing a second gate cut and a second S/D cut at locations that are substantially aligned with the second dielectric bar 312 and the modified second dielectric bar 322. In other words, the first and the second gate cut and the first and the second S/D cut may be performed at a first and a second cell boundary of the semiconductor structure 10. More specifically, as is illustrated in FIG. 17B, a first trench opening 701 (or gate cut region) and a second trench opening 702 (or gate cut region) may be created in the raw metal gates 450, through a non-selective etch process using hard masks. The first trench opening 701 may separate a metal gate of the first nanosheet transistor 2711 from rest of the raw metal gate 450 such as from a metal gate of the second nanosheet transistor 2712. The second trench opening 702 may separate a metal gate of the fourth nanosheet transistor 2722 from the rest of the raw metal gate 450 such as from a metal gate of the third nanosheet transistor 2721. In one embodiment, the raw metal gate 450 between the first trench opening 701 and the second trench opening 702 forms a merged metal gate of the second and the third nanosheet transistors 2712 and 2721.

The first and the second trench opening 701 and 702 may cut through the ILD layer 602, the dielectric cap layer 451, and the raw metal gate 450, and may remove a portion of the exposed first and second dielectric bar 311 and 312 to stop at the TDI 206. In the meantime, as is illustrated in FIG. 17C, the first and the second trench opening 701 and 702 may be created in the S/D areas of the nanosheet transistors to cut through the ILD layers 602 and 601 and possibly a portion of the S/D contact 611. The non-selective etch process may stop preferably at the top surfaces of the first raw S/D region 510 and the second raw S/D region 520.

Figures 18A, 18B, 18C:
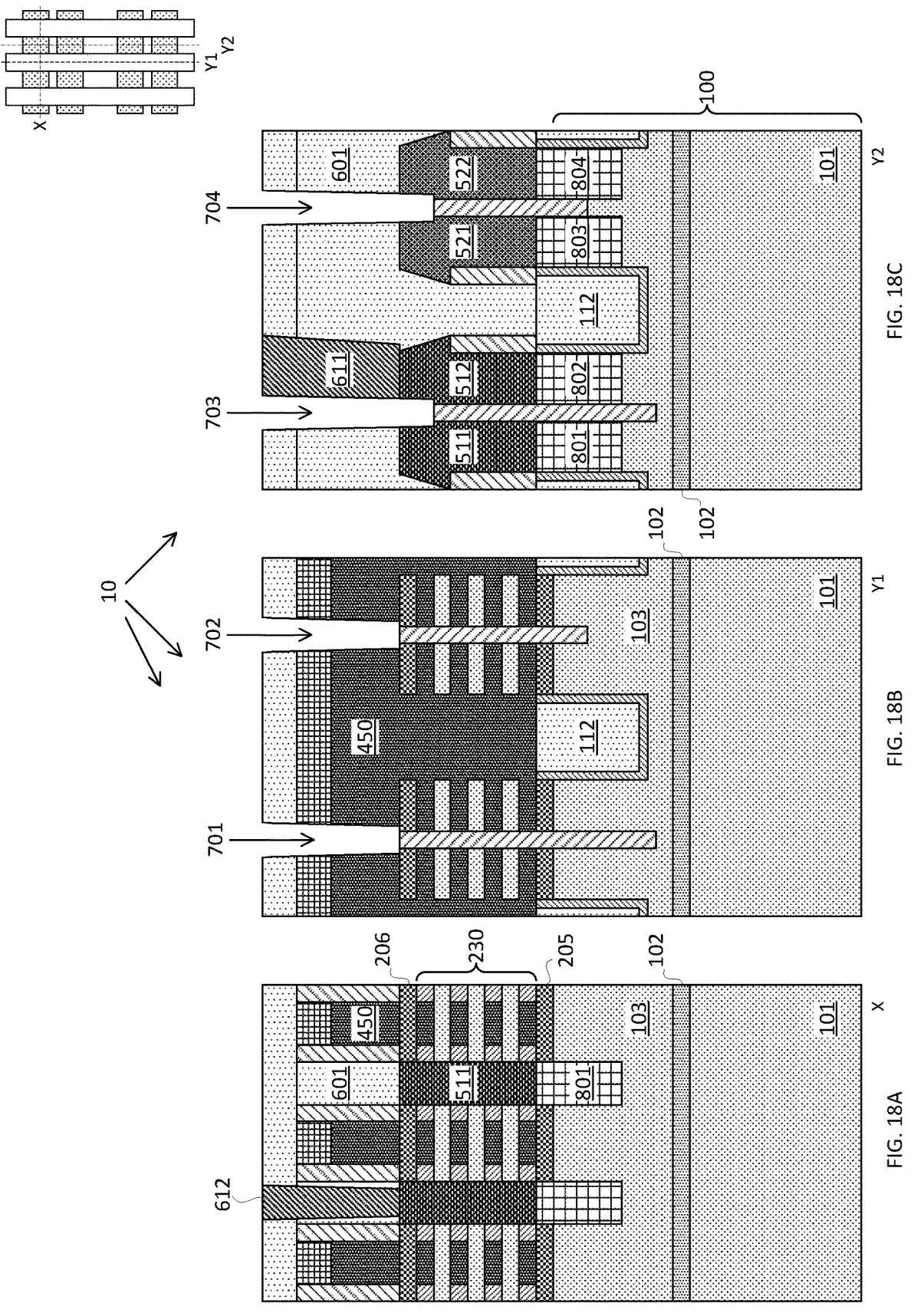

FIGS. 18A, 18B, and 18C are demonstrative illustrations of different cross-sectional views of a semiconductor structure in a step of manufacturing thereof according to one embodiment of present invention. More particularly, following the step illustrated in FIGS. 17A, 17B, and 17C, embodiments of present invention provide further etching the exposed first and second raw S/D regions 510 and 520 in a selective etch process until the modified first and the modified second dielectric bar 321 and 322 are revealed or exposed, thereby forming S/D cut regions or trench openings 703 and 704. Because of the selective nature of the etch process to the TDI 206 and the first and the second vertical bar 311 and 312, the gate cut regions or trench openings 701 and 702 in the region of the raw metal gates 450 may remain substantially unaffected by the further etch of the S/D regions 510 and 520 and/or S/D contacts, such as the S/D contact 611, on top thereof. It is to be noted here that cutting a merged S/D contact into two separate S/D contacts, in a S/D region cut process, is generally considered as more viable than forming two separate S/D contacts through a lithographic patterning and/or printing process. The use of the TDI 206 in embodiments of present invention enables such S/D region cut process. The etch of the raw S/D region 510 creates a first S/D region 511 and a second S/D region 512 of the first pair 271 of nanosheet transistors, and the etch of the raw S/D region 520 creates a first S/D region 521 and a second S/D region 522 of the second pair 272 of nanosheet transistors.

FIGS. 19A, 19B, and 19C are demonstrative illustrations of different cross-sectional views of a semiconductor structure in a step of manufacturing thereof according to one embodiment of present invention. More particularly, following the step illustrated in FIGS. 18A, 18B, and 18C, embodiments of present invention provide depositing dielectric material into the gate cut regions or trench openings 701 and 702 to form a first and a second trench insulator 711 and 712 directly above the first and the second dielectric bar 311 and 312 in the region of the one or more raw metal gates 450. Embodiments of present invention also provide depositing dielectric material into the S/D cut regions or trench openings 703 and 704 to form a first and a second trench insulator 713 and 714 directly above the modified first and the modified second dielectric bar 321 and 322 in the raw S/D regions 510 and 520. The dielectric material may continue to be deposited on top of the S/D contacts 611 and 612 and on top of the ILD layer 602 to form an ILD layer 720.

FIGS. 20A, 20B, and 20C are demonstrative illustrations of different cross-sectional views of a semiconductor structure in a step of manufacturing thereof according to one embodiment of present invention. More particularly, following the step illustrated in FIGS. 19A, 19B, and 19C, embodiments of present invention provide forming, for example, a gate contact 721 through the ILD layer 720, the ILD layer 602, and the dielectric cap layer 451 to be in contact with the raw metal gate 450, and forming a via contact 722 through the ILD layer 720 to contact the S/D contact 611. Embodiments of present invention further provide forming a back-end-of-line (BEOL) structure 730 on top of the ILD layer 720. The BEOL structure 730 may include one or more metal levels providing signal routing and/or power supply functions to the underneath nanosheet transistors such as the first pair 271 and the second pair 272 of nanosheet transistors. Next, a carrier wafer 740 may be bonded onto the BEOL structure 730 such that the semiconductor structure 10 under manufacturing may be flipped upside-down for further processing from the backside of the semiconductor substrate 100.

It is to be noted here that upside-up (instead of upside-down) drawings will continue to be used hereinafter for FIGS. 21A, 21B, and 21C to FIGS. 26A, 26B, and 26C, for the ease of illustration. However, description of the drawings may be provided in a manner that is consistent with a situation where the semiconductor structure 10 is flipped upside-down and being processed from the backside of the semiconductor substrate 100.

Figures 21A, 21B, 21C:
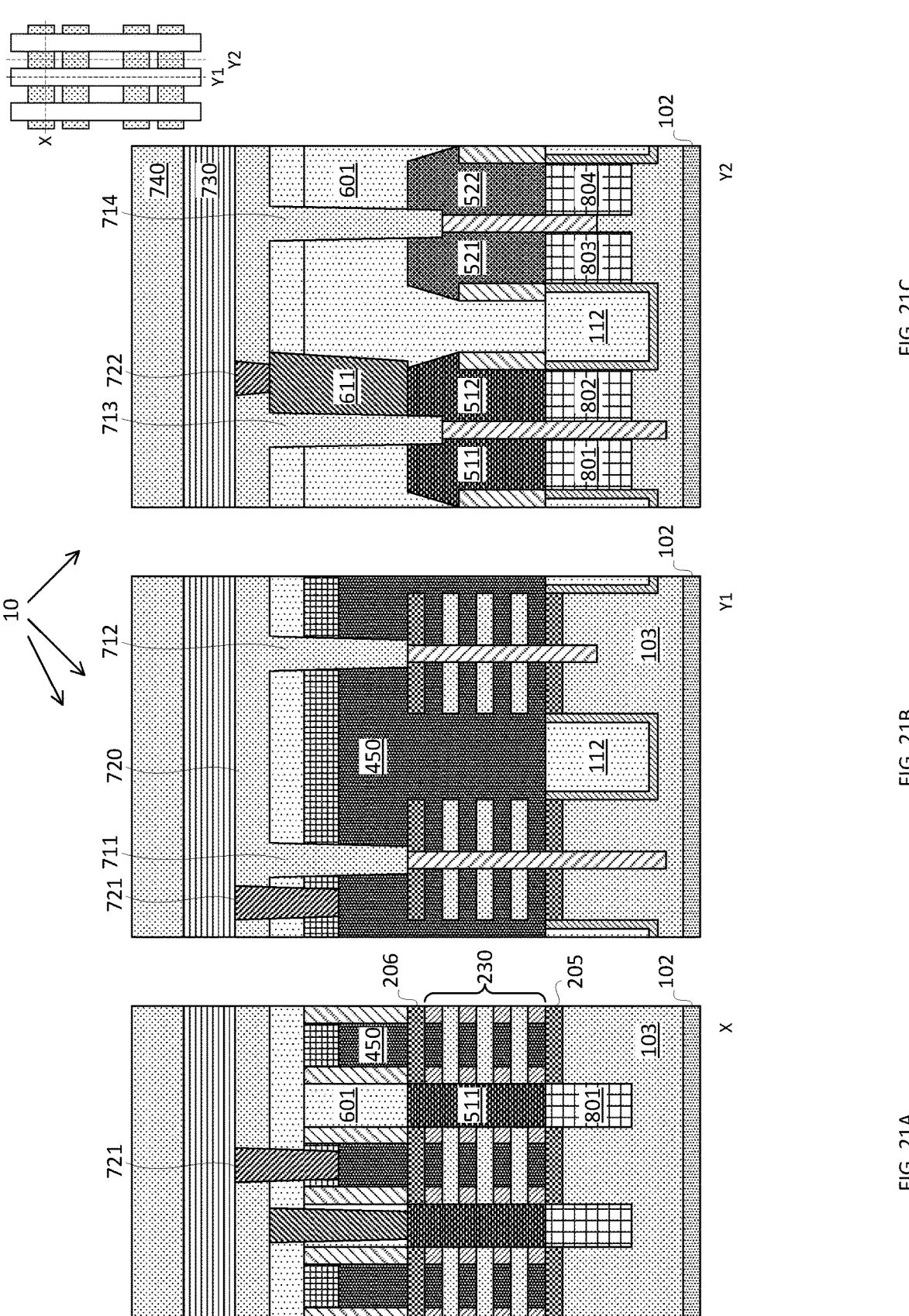

FIGS. 21A, 21B, and 21C are demonstrative illustrations of different cross-sectional views of a semiconductor structure in a step of manufacturing thereof according to one embodiment of present invention. More particularly, following the step illustrated in FIGS. 20A, 20B, and 20C, embodiments of present invention provide selectively removing the Si substrate 101 from the backside of the semiconductor substrate 100. The removal of the Si substrate 101 may be made through a combination of, for example, wafer grinding, CMP, and/or dry and wet etch process and may stop at the etch-stop layer 102.

Figures 22A, 22B, 22C:
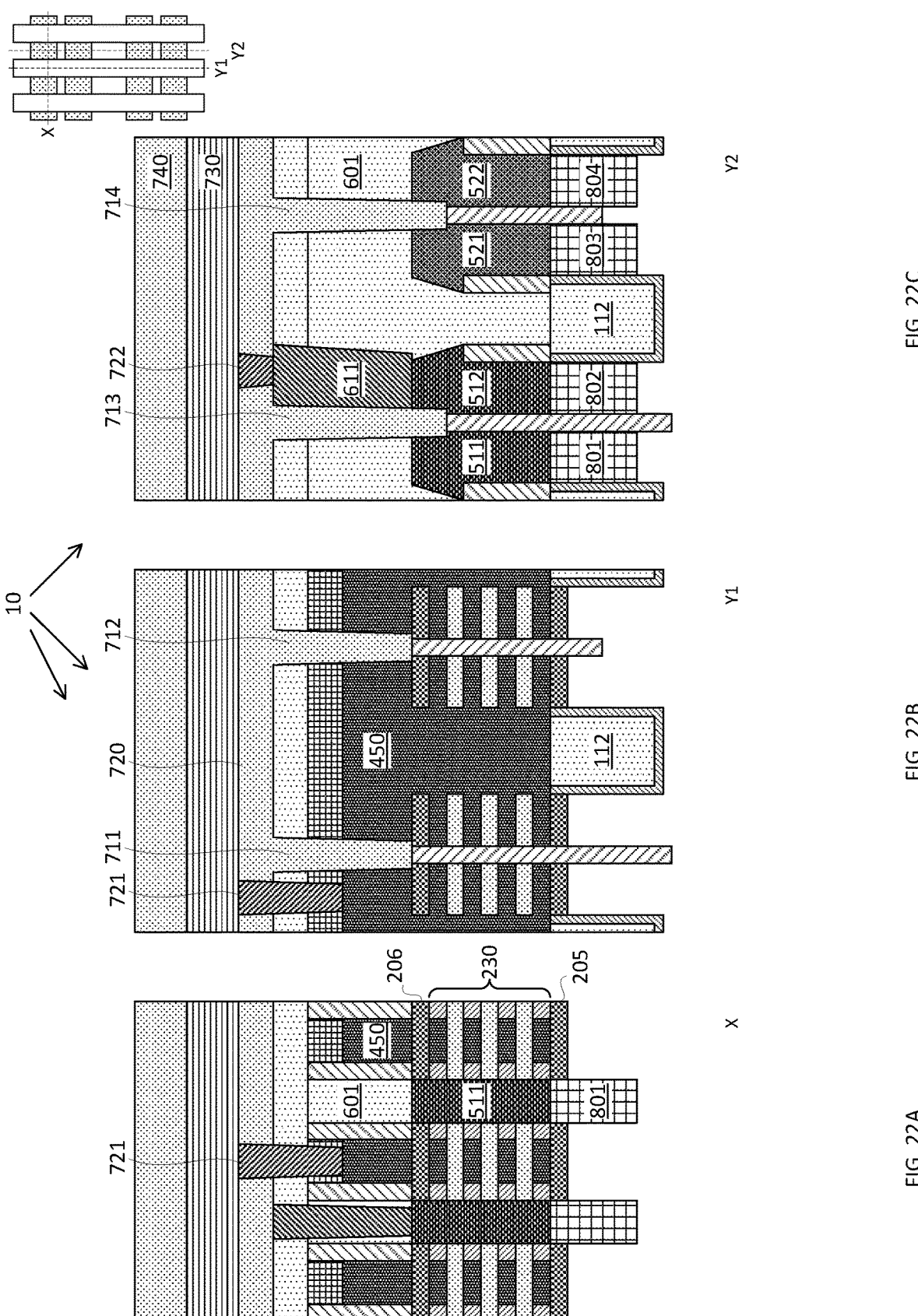

FIGS. 22A, 22B, and 22C are demonstrative illustrations of different cross-sectional views of a semiconductor structure in a step of manufacturing thereof according to one embodiment of present invention. More particularly, following the step illustrated in FIGS. 21A, 21B, and 21C, embodiments of present invention provide removing the etch-stop layer 102, and then selectively removing the Si layer 103 thereby leaving the first dielectric bar 311 and the modified first dielectric bar 321, the second dielectric bar 312 and the modified second dielectric bar 322, the placeholders 801, 802, 803, and 804, and the STI 110 exposed.

Figures 23A, 23B, 23C:
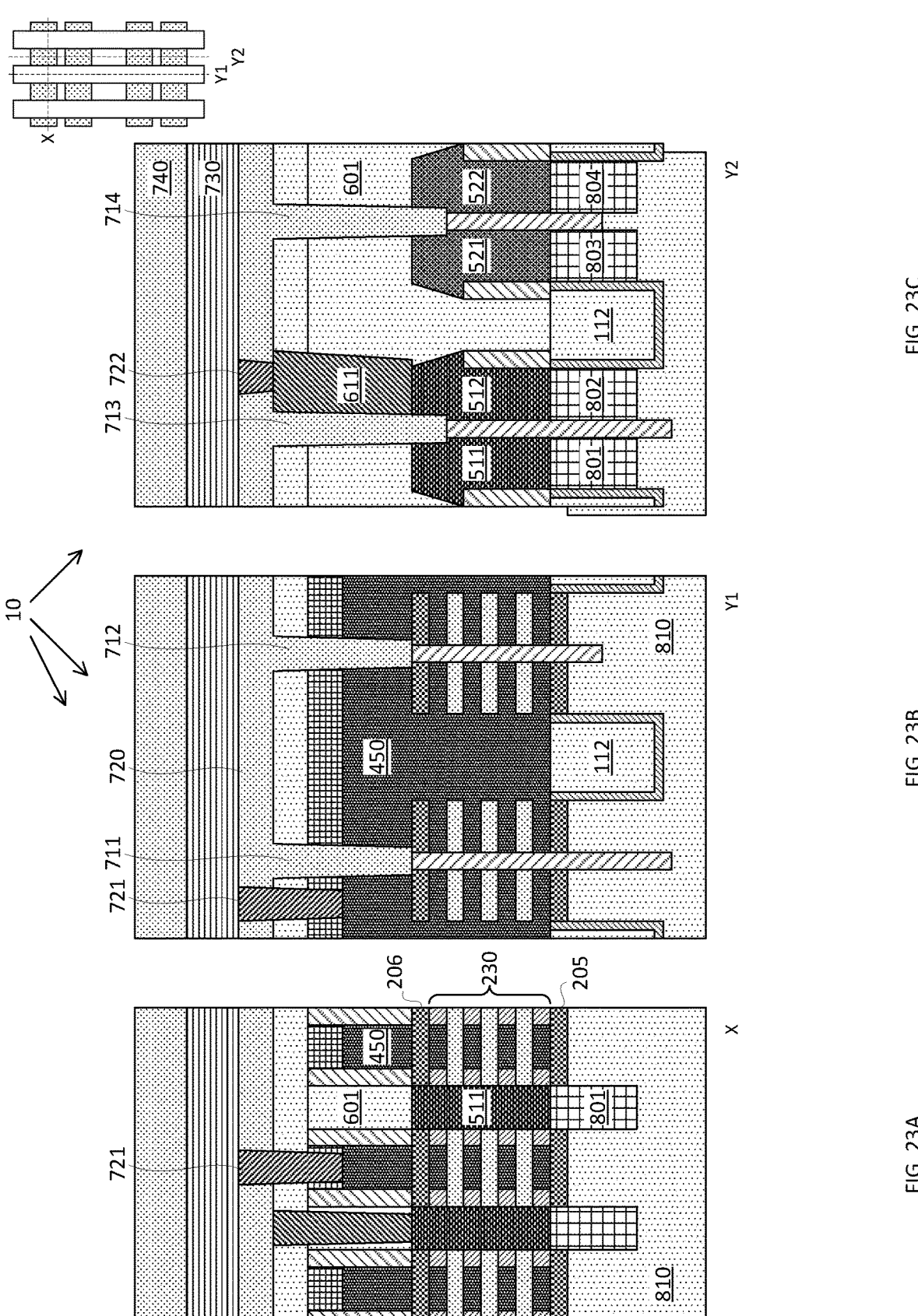

FIGS. 23A, 23B, and 23C are demonstrative illustrations of different cross-sectional views of a semiconductor structure in a step of manufacturing thereof according to one embodiment of present invention. More particularly, following the step illustrated in FIGS. 22A, 22B, and 22C, embodiments of present invention provide depositing dielectric material to form a backside interlevel dielectric (BILD) layer 810 covering the exposed first dielectric bar 311 and the modified first dielectric bar 321, the second dielectric bar 312 and the modified second dielectric bar 322, the placeholders 801, 802, 803, and 804, and the STI 110. The BILD layer 810 may be formed through a PVD process, a CVD process, or an ALD process. A CMP process may subsequently be applied to planarize a top surface of the BILD layer 810 for further processing such as for lithographic patterning the BILD layer 810.

Figures 24A, 24B, 24C:
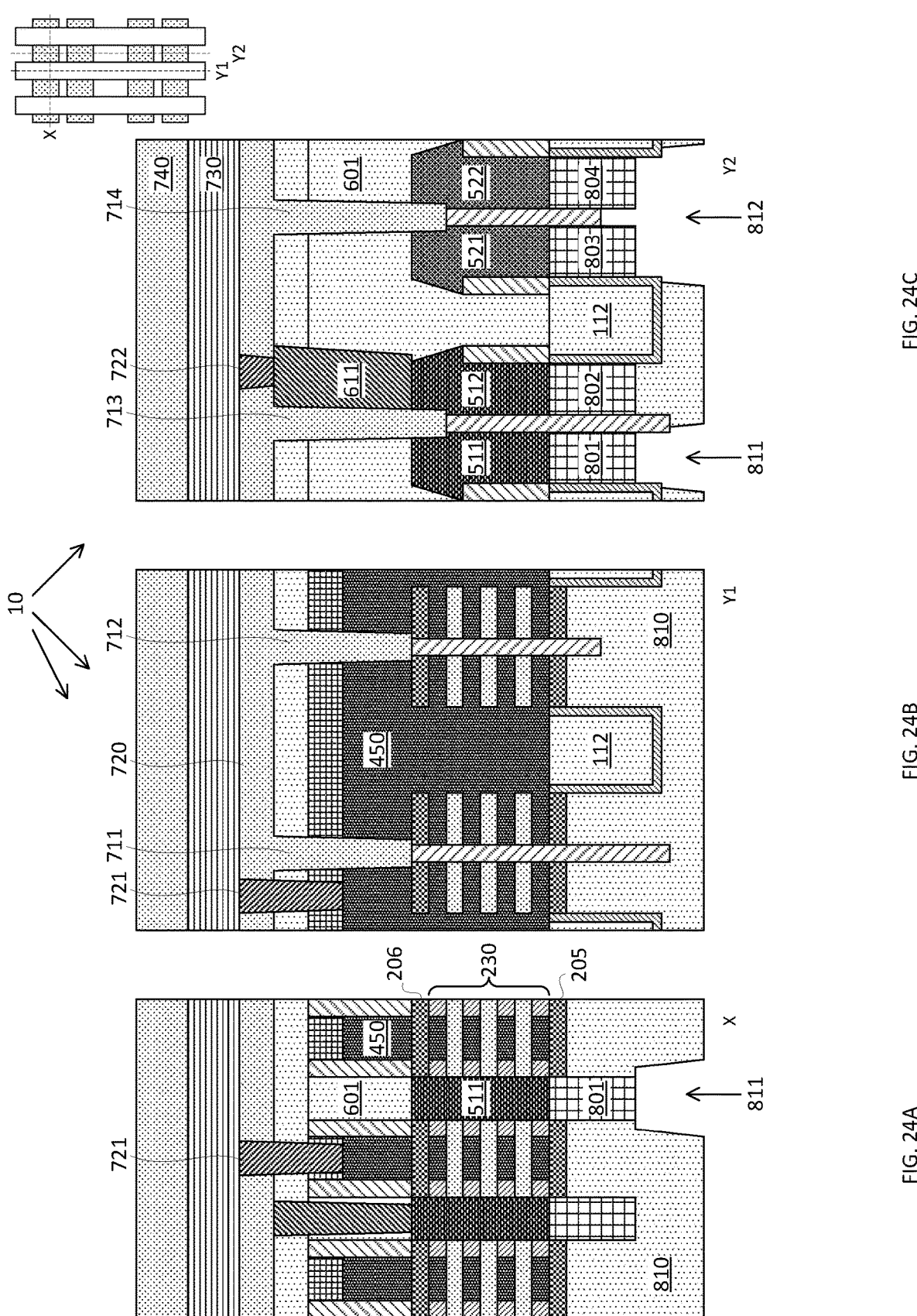

FIGS. 24A, 24B, and 24C are demonstrative illustrations of different cross-sectional views of a semiconductor structure in a step of manufacturing thereof according to one embodiment of present invention. More particularly, following the step illustrated in FIGS. 23A, 23B, and 23C, embodiments of present invention provide creating one or more openings to expose one or more of the placeholders previously in the Si layer 103 and now are covered by or embedded in the BILD layer 810. For example, a first opening 811 may be created in the BILD layer 810 to expose the first placeholder 801, and a second opening 812 may be created in the BILD layer 810 to expose the third and the fourth placeholder 803 and 804. Here, it is to be noted that because the third and the fourth placeholder 803 and 804 were previously formed deeper into the Si layer 103 than the modified second dielectric bar 322, the modified second dielectric bar 322 only partially separate the third placeholder 803 from the fourth placeholder 804. The BILD layer 810 in-between the third and the fourth placeholder 803 and 804 may be removed as well.

Figures 25A, 25B, 25C:

FIGS. 25A, 25B, and 25C are demonstrative illustrations of different cross-sectional views of a semiconductor structure in a step of manufacturing thereof according to one embodiment of present invention. More particularly, following the step illustrated in FIGS. 24A, 24B, and 24C, embodiments of present invention provide selectively removing the exposed first placeholder 801 thereby exposing a bottom surface of the first S/D region 511 of the first pair 271 of nanosheet transistors, and selectively removing the exposed third and the exposed fourth placeholder 803 and 804 thereby exposing bottom surfaces of the third S/D region 521 and the fourth S/D region 522 of the second pair 272 of nanosheet transistors. A bottom portion of the modified second dielectric bar 322 may be exposed as well.

Embodiments of present invention further provide depositing conductive materials such as a silicide liner, such as for example titanium (Ti), nickel (Ni), and/or nickel-platinum (NiPt), an adhesion metal liner, such as titanium-nitride (TiN), and conductive metals, such as W, Co, Ru, or other suitable materials onto the exposed bottom surface of the first S/D region 511 to form a first backside contact (BSCA) 821 and onto the bottom surfaces of the third and the fourth S/D region 521 and 522 to form a second BSCA 822. In an upside-down view, the second BSCA 822 may a merged contact for the third and the fourth S/D region 521 and 522 and may saddle on top of the modified second dielectric bar 322 as well. A CMP process may subsequently be applied to planarize top surfaces of the first BSCA 821 and the second BSCA 822 with the top surface of the BILD layer 810.

Figures 26A, 26B, 26C:
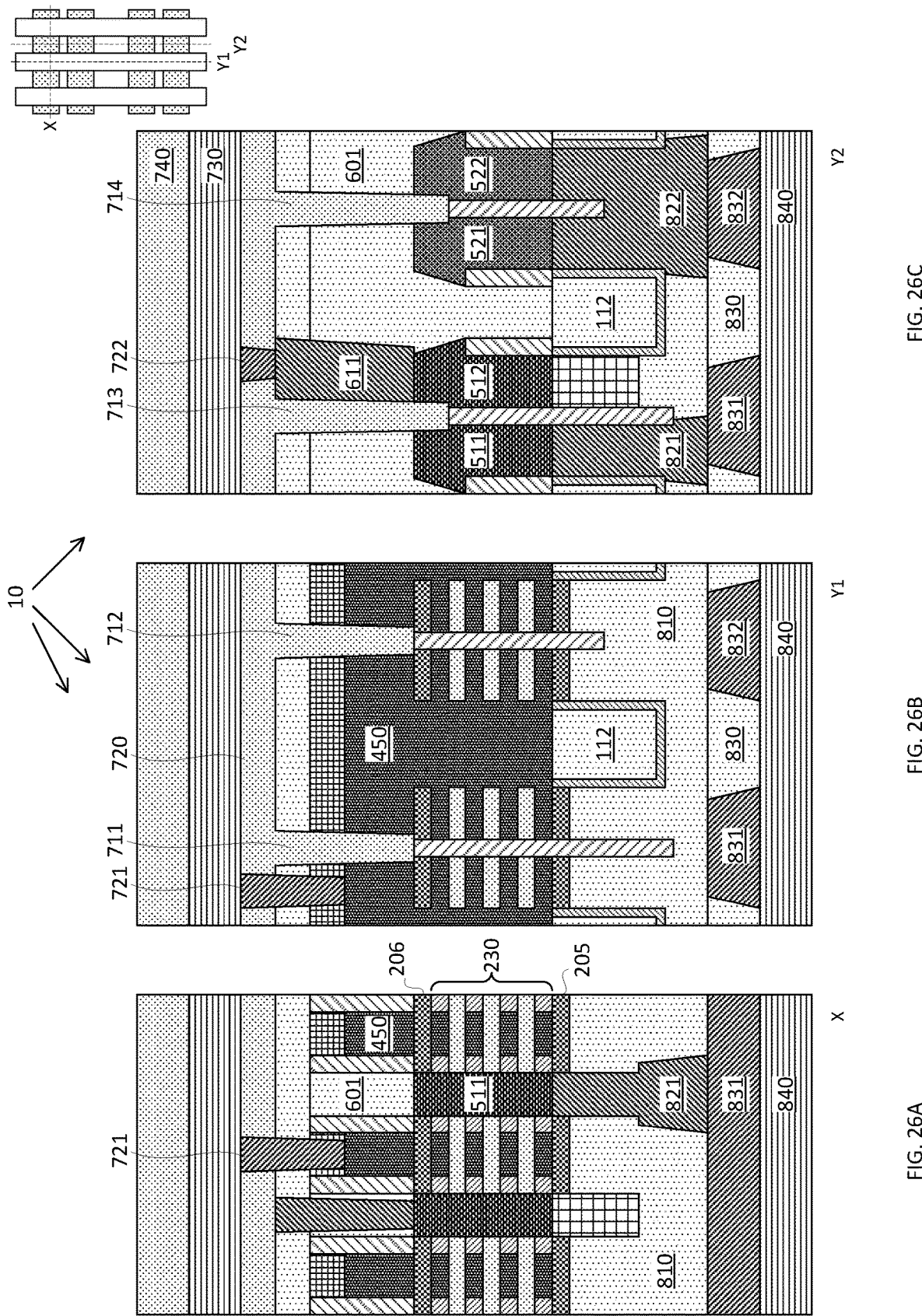

FIGS. 26A, 26B, and 26C are demonstrative illustrations of different cross-sectional views of a semiconductor structure in a step of manufacturing thereof according to one embodiment of present invention. More particularly, following the step illustrated in FIGS. 25A, 25B, and 25C, embodiments of present invention provide forming an BILD layer 830 on top of the first BSCA 821, the second BSCA 822, and the BILD layer 810; and forming one or more backside power rails (BSPRs) such as a first BSPR 831 and a second BSPR 832 in the BILD layer 830. Thereafter, a backside power distribution network (BSPDN) 840 may be formed on top of the one or more BSPRs 831 and 832 and on top of the BILD layer 830.

FIG. 27 is a demonstrative illustration of a flow-chart of a method of manufacturing a semiconductor structure according to embodiments of present invention. The method includes (910) forming a first dielectric bar of a first depth between a first and a second set of nanosheets of a first and a second nanosheet transistor and forming a second dielectric bar of a second depth between a third and a fourth set of nanosheets of a third and a fourth nanosheet transistor, the first depth is deeper than the second depth; (920) lowering heights of the first and the second dielectric bar in the source/drain area of the first, second, third, and fourth nanosheet transistors; (930) recessing regions of a substrate underneath the source/drain area of the transistors to create placeholders for forming backside contacts; (940) forming a first raw S/D region in the S/D areas of the first and the second transistors and a second raw S/D region in the S/D area of the third and the fourth transistors; (950) forming a raw metal gate surrounding the nanosheets in the respective gate areas of the first, second, third, and fourth transistors; (960) performing a first and a second gate cut to cut the raw metal gate to create a first and a second gate cut regions and form trench insulators therein to separate metal gates of the first and the fourth transistors from rest of the raw metal gate, which may form a merged metal gate of the second and the third transistors; (970) performing a first and a second S/D cut to separate the first raw S/D region into a first and a second S/D region of the first and the second transistor and to separate the second raw S/D region into a third and a fourth S/D region of the third and the fourth transistor; and (980) replacing one or more of the placeholders with backside contacts in a process performed from a backside of the substrate.

It is to be understood that the exemplary methods discussed herein may be readily incorporated with other semiconductor processing flows, semiconductor devices, and integrated circuits with various analog and digital circuitry or mixed-signal circuitry. In particular, integrated circuit dies can be fabricated with various devices such as field-effect transistors, bipolar transistors, metal-oxide-semiconductor transistors, diodes, capacitors, inductors, etc. An integrated circuit in accordance with the present invention can be employed in applications, hardware, and/or electronic systems. Suitable hardware and systems for implementing the invention may include, but are not limited to, personal computers, communication networks, electronic commerce systems, portable communications devices (e.g., cell phones), solid-state media storage devices, functional circuitry, etc. Systems and hardware incorporating such integrated circuits are considered part of the embodiments described herein. Given the teachings of the invention provided herein, one of ordinary skill in the art will be able to contemplate other implementations and applications of the techniques of the invention.

Accordingly, at least portions of one or more of the semiconductor structures described herein may be implemented in integrated circuits. The resulting integrated circuit chips may be distributed by the fabricator in raw wafer form (that is, as a single wafer that has multiple unpackaged chips), as a bare die, or in a packaged form. In the latter case the chip may be mounted in a single chip package (such as a plastic carrier, with leads that are affixed to a motherboard or other high-level carrier) or in a multichip package (such as a ceramic carrier that has surface interconnections and/or buried interconnections). In any case the chip may then be integrated with other chips, discrete circuit elements, and/or other signal processing devices as part of either an intermediate product, such as a motherboard, or an end product. The end product may be any product that includes integrated circuit chips, ranging from toys and other low-end applications to advanced computer products having a display, a keyboard or other input device, and a central processor.

The descriptions of various embodiments of present invention have been presented for the purposes of illustration and they are not intended to be exhaustive and present invention are not limited to the embodiments disclosed. The terminology used herein was chosen to best explain the principles of the embodiments, practical application or technical improvement over technologies found in the marketplace, and to enable others of ordinary skill in the art to understand the embodiments disclosed herein. Many modifications, substitutions, changes, and equivalents will now occur to those of ordinary skill in the art. Such changes, modification, and/or alternative embodiments may be made without departing from the spirit of present invention and are hereby all contemplated and considered within the scope of present invention. It is, therefore, to be understood that the appended claims are intended to cover all such modifications and changes as fall within the spirit of the invention.

What is claimed is:

1. A semiconductor structure comprising:
a first dielectric bar having a left sidewall and a right sidewall;
a first nanosheet transistor having a first set of channel nanosheets in direct contact with the left sidewall of the first dielectric bar;
a second nanosheet transistor having a second set of channel nanosheets in direct contact with the right sidewall of the first dielectric bar; and
a second dielectric bar between a third and a fourth nanosheet transistor,
wherein a first portion of the first dielectric bar between the first and the second set of channel nanosheets has a first height; a second portion of the first dielectric bar between a first source/drain (S/D) region of the first nanosheet transistor and a second S/D region of the second nanosheet transistor has a second height; and the first height is higher than the second height, and
wherein a lowermost surface of the first dielectric bar has a first depth, a lowermost surface of the second dielectric bar has a second depth, and the first depth is deeper than the second depth relative to a bottom of the first and second sets of channel nanosheets.

2. The semiconductor structure of claim 1, further comprising a top dielectric insulator above the first and the second set of channel nanosheets and in direct contact with the left and the right sidewall of the first dielectric bar, wherein the top dielectric insulator is surrounded by a gate of the first nanosheet transistor and a gate of the second nanosheet transistor.

3. The semiconductor structure of claim 1, wherein the first S/D region of the first nanosheet transistor and the second S/D region of the second nanosheet transistor have a height higher than the second height of the second portion of the first dielectric bar and are insulated from each other by a trench insulator in a S/D cut region directly above the first dielectric bar.

4. The semiconductor structure of claim 3, wherein both the first and the second nanosheet transistor are either a p-type transistor or an n-type transistor.

5. The semiconductor structure of claim 1, further comprising a backside contact surrounding a lower portion of the second dielectric bar and contacting both a bottom surface of a third S/D region of the third nanosheet transistor and a bottom surface of a fourth S/D region of the fourth nanosheet transistor.

6. The semiconductor structure of claim 1, further comprising a backside contact contacting a bottom surface of the first S/D region of the first nanosheet transistor, wherein the second S/D region of the second nanosheet transistor is on top of a placeholder, and the placeholder is separated from the backside contact of the first S/D region of the first nanosheet transistor by the first dielectric bar.

7. A method of forming a semiconductor structure comprising:
forming a first dielectric bar between a first set of channel nanosheets of a first nanosheet transistor and a second set of channel nanosheets of a second nanosheet transistor and forming a second dielectric bar between a third set of channel nanosheets of a third nanosheet transistor and a fourth set of channel nanosheets of a fourth nanosheet transistor, the first and the second dielectric bar each having a left sidewall and a right sidewall, the first and the second set of channel nanosheets in direct contact with the left and the right sidewall of the first dielectric bar respectively, the third and the fourth set of channel nanosheets in direct contact with the left and the right sidewall of the second dielectric bar respectively, wherein a lowermost surface of the first dielectric bar has a first depth, a lowermost surface of the second dielectric bar has a second depth, and the first depth is deeper than the second depth relative to a bottom of the first and second sets of channel nanosheets;

lowering a height of the first dielectric bar in a source/drain (S/D) area of the first and the second nanosheet transistors and lowering a height of the second dielectric bar at a S/D area of the third and the fourth nanosheet transistors;

forming a first raw S/D region in the S/D area of the first and the second nanosheet transistors and forming a second raw S/D region in the S/D area of the third and the fourth nanosheet transistors; and performing a first S/D cut to separate the first raw S/D region into a first S/D region of the first nanosheet transistor and a second S/D region of the second nanosheet transistor and performing a second S/D cut to separate the second raw S/D region into a third S/D region of the third nanosheet transistor and a fourth S/D region of the fourth nanosheet transistor.

8. The method of claim 7, further comprising forming a raw metal gate surrounding the first, the second, the third, and the fourth set of channel nanosheets in a gate area of the first, the second, the third, and the fourth nanosheet transistor.

9. The method of claim 8, further comprising:

performing a first gate cut to create a first gate cut region that separates a metal gate of the first nanosheet transistor from rest of the raw metal gate; and performing a second gate cut to create a second gate cut region that separates a metal gate of the fourth nanosheet transistor from rest of the raw metal gate.

10. The method of claim 9, further comprising filling the first and the second gate cut region with a dielectric material to form a first and a second trench insulator, the first and the second trench insulator forming a first and a second cell boundary.

11. The method of claim 7, further comprising:

creating a first and a second recess in a substrate below the S/D area of the first and the second nanosheet transistors and filling the first and the second recess with an epitaxial material to form a first and a second placeholder; and creating a third and a fourth recess in the substrate below the S/D area of the third and the fourth nanosheet transistors and filling the third and the fourth recess with an epitaxial material to form a third and a fourth placeholder.

12. The method of claim 11, further comprising replacing one or more of the first, the second, the third, and the fourth placeholders with one or more backside contacts in a process performed from a backside of the substrate.

13. A semiconductor structure comprising:

a first and a second dielectric bar each having a left sidewall and a right sidewall;

a first pair of nanosheet transistors having a first and a second set of channel nanosheets in direct contact with the left and the right sidewall of the first dielectric bar respectively; and a second pair of nanosheet transistors having a third and a fourth set of channel nanosheets in direct contact with the left and the right sidewall of the second dielectric bar respectively, wherein a lowermost surface of the first dielectric bar has a first depth, a lowermost surface of the second dielectric bar has a second depth, and the first depth is deeper than the second depth relative to a bottom of the first and second sets of channel nanosheets.

14. The semiconductor structure of claim 13, further comprising a top dielectric insulator above the first and the second set of channel nanosheets and in direct contact with the left and the right sidewall of the first dielectric bar, the top dielectric insulator being surrounded by a first and a second gate of the first pair of nanosheet transistors.

15. The semiconductor structure of claim 14, wherein the first and the second gate of the first pair of transistors are insulated from each other by a trench insulator in a gate cut region directly above the first dielectric bar.

16. The semiconductor structure of claim 13, wherein a first and a second source/drain (S/D) region of the first pair of nanosheet transistors have a height higher than a height of a portion of the first dielectric bar between the first and the second S/D region of the first pair of nanosheet transistors; and are insulated from each other by a trench insulator in a S/D cut region directly above the first dielectric bar and by the first dielectric bar.

17. The semiconductor structure of claim 16, further comprising a first sidewall spacer at a sidewall of the first S/D region of the first pair of nanosheet transistors and a second sidewall spacer at a sidewall of the second S/D region of the first pair of nanosheet transistors.

18. The semiconductor structure of claim 13, wherein the first pair of nanosheet transistors are a first type of transistors and the second pair of nanosheet transistors are a second type of transistors, and the first type is different from the second type.

19. The semiconductor structure of claim 13, wherein the first dielectric bar has a first depth and the second dielectric bar has a second depth, and the first depth is deeper than second depth.

\* \* \* \* \*